United States Patent
Kusaka et al.

(10) Patent No.: US 8,558,940 B2
(45) Date of Patent: Oct. 15, 2013

(54) IMAGE SENSOR AND IMAGE-CAPTURING DEVICE

(75) Inventors: Yosuke Kusaka, Yokohama (JP); Satoshi Suzuki, Tokyo (JP)

(73) Assignee: Nikon Corporation, Tokyo (JP)

( * ) Notice: Subject to any disclaimer, the term of this patent is extended or adjusted under 35 U.S.C. 154(b) by 637 days.

(21) Appl. No.: 12/591,649

(22) Filed: Nov. 25, 2009

(65) Prior Publication Data

US 2010/0188532 A1 Jul. 29, 2010

Related U.S. Application Data

(60) Provisional application No. 61/202,282, filed on Feb. 13, 2009.

(30) Foreign Application Priority Data

| Nov. 27, 2008 | (JP) | ................................. 2008-302972 |
| Feb. 13, 2009 | (JP) | ................................. 2009-031335 |
| Jul. 29, 2009 | (JP) | ................................. 2009-176543 |

(51) Int. Cl.
 *H04N 5/232* (2006.01)
 *G03B 13/36* (2006.01)

(52) U.S. Cl.
 USPC ............................................ 348/345; 396/99

(58) Field of Classification Search
 USPC ............. 348/345, 362, 363, 372–376; 396/99
 See application file for complete search history.

(56) References Cited

U.S. PATENT DOCUMENTS

| 6,410,466 B1 | 6/2002 | Goto et al. |
| 6,560,049 B2 | 5/2003 | Goto et al. |
| 6,677,259 B2 | 1/2004 | Carpenter et al. |
| 7,098,951 B2 | 8/2006 | Arima |
| 7,586,588 B2 | 9/2009 | Kusaka |
| 2003/0058358 A1 | 3/2003 | Arima |
| 2008/0317454 A1* | 12/2008 | Onuki ........................... 396/128 |
| 2009/0115882 A1* | 5/2009 | Kawarada ..................... 348/340 |

FOREIGN PATENT DOCUMENTS

| JP | A-1-216306 | 8/1989 |
| JP | A-06-313844 | 11/1994 |
| JP | A-2001-048584 | 2/2001 |
| JP | A-2003-153291 | 5/2003 |

(Continued)

OTHER PUBLICATIONS

Japanese Office Action issued in Japanese Patent Application No. 2008-302972 dated Oct. 26, 2010 (with translation).

(Continued)

*Primary Examiner* — Trung Diep
(74) *Attorney, Agent, or Firm* — Oliff & Berridge, PLC

(57) ABSTRACT

An image sensor includes: a plurality of image-capturing pixels that, upon each receiving a partial light flux within a predetermined wavelength range, which is part of a photographic light flux used to form an optical image, output image signals corresponding to the optical image; a plurality of focus detection pixels that receive a pair of focus detection light fluxes in a wider wavelength range than the predetermined wavelength range and output a pair of focus detection signals; and a reduction unit that adjusts a signal level of the focus detection signals output from the plurality of focus detection pixels to be equal to or less than a signal level of the image signals each output from one of the plurality of image-capturing pixels under a given light receiving condition.

8 Claims, 30 Drawing Sheets

(56) References Cited

FOREIGN PATENT DOCUMENTS

| | | |
|---|---|---|
| JP | A-2003-169252 | 6/2003 |
| JP | A-2003-273338 | 9/2003 |
| JP | A-2005-303409 | 10/2005 |
| JP | A-2007-103590 | 4/2007 |
| JP | A-2007-333720 | 12/2007 |
| JP | A-2009-017152 | 1/2009 |
| JP | A-2009-244862 | 10/2009 |
| WO | WO 2009/113644 A1 | 9/2009 |

OTHER PUBLICATIONS

Japanese Office Action issued in Japanese Patent Application No. 2009-176543 dated Jan. 11, 2011 (with translation).

* cited by examiner

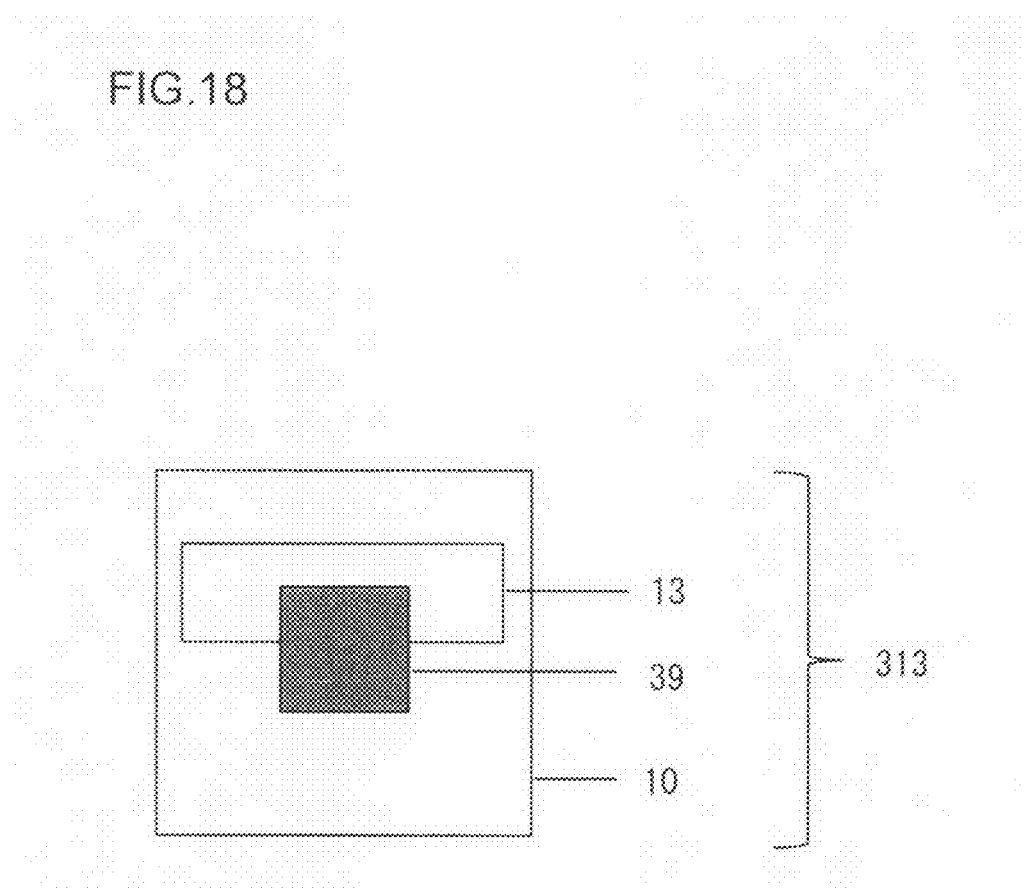

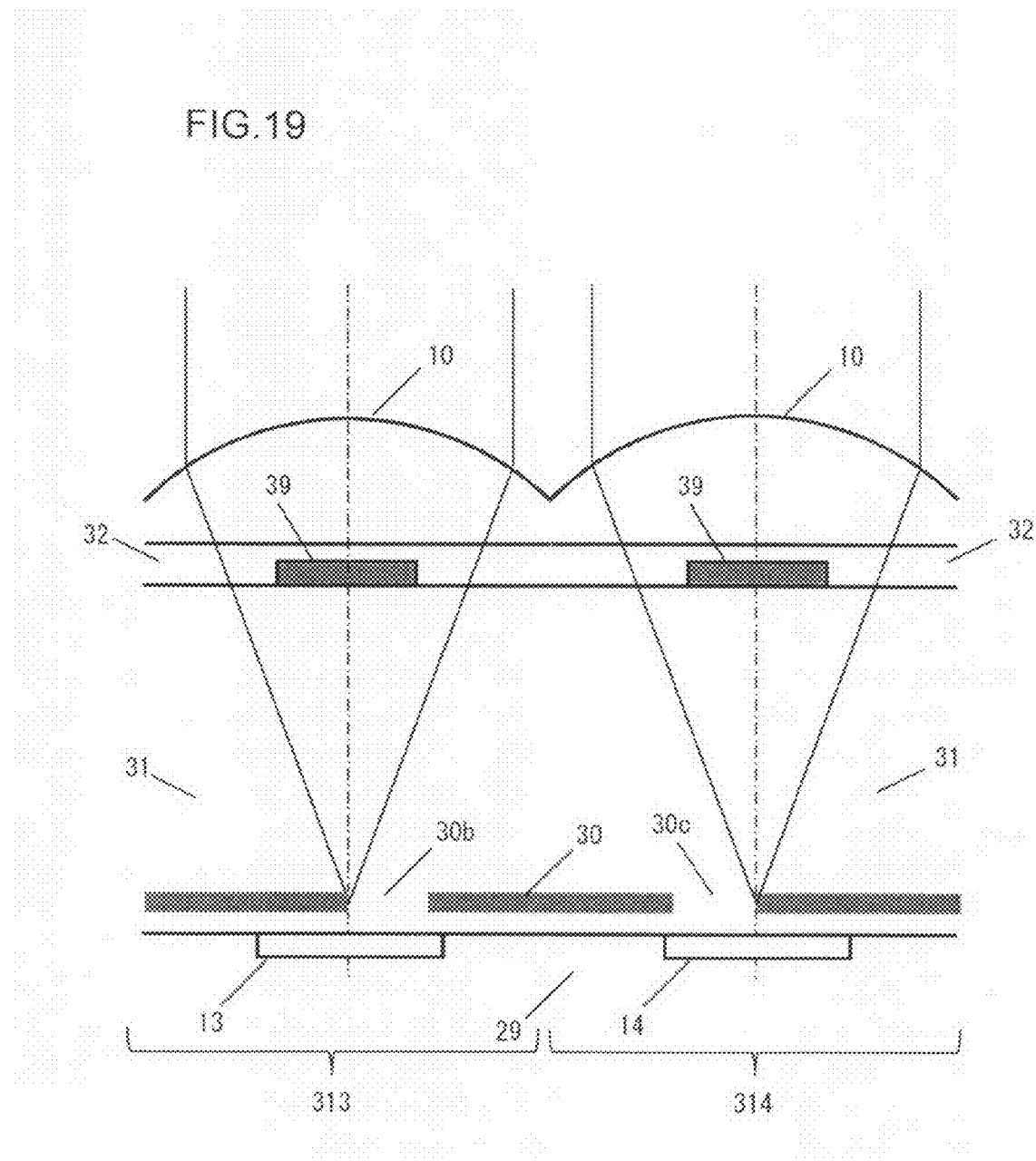

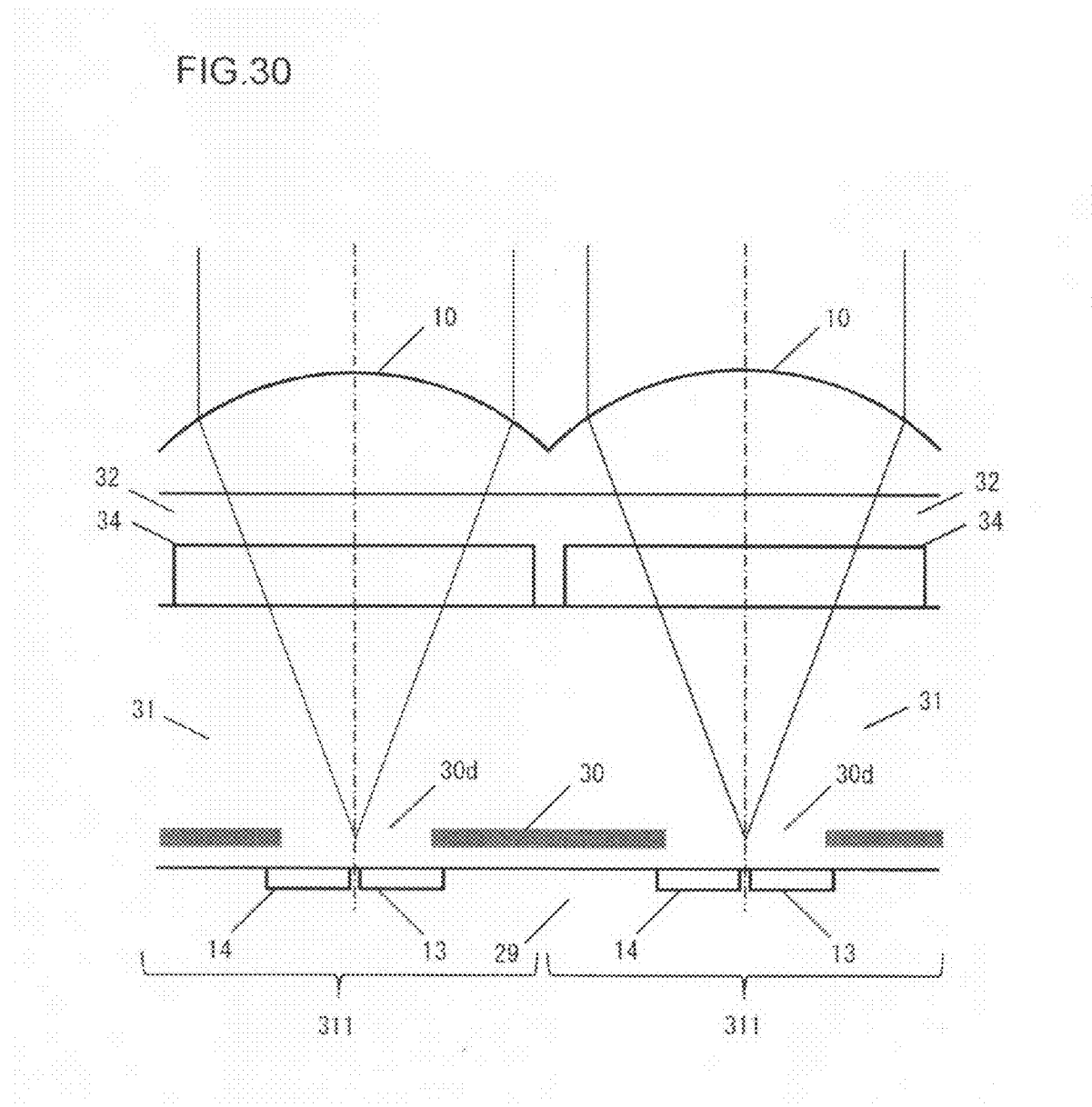

IMAGE SENSOR AND IMAGE-CAPTURING DEVICE

INCORPORATION BY REFERENCE

The disclosures of the following priority applications are herein incorporated by reference: Japanese Patent Application No. 2008-302972 filed Nov. 27, 2008, Japanese Patent Application No. 2009-031335 filed Feb. 13, 2009, U.S. Provisional Patent Application No. 61/202,282, Feb. 13, 2009, and Japanese Patent Application No. 2009-176543 filed Jul. 29, 2009.

BACKGROUND OF THE INVENTION

1. Field of the Invention

The present invention relates to an image sensor and an image-capturing device.

2. Description of Related Art

The image-capturing devices known in the related art include that disclosed in Japanese Laid Open Patent Publication No. H1-216306. This image-capturing device includes an image-capturing means achieved by arraying a plurality of focus detection pixels, via which a pair of image signals corresponding to a pair of images formed with a pair of light fluxes passing through an optical system are generated, as part of an array of image-capturing pixels assuming a pixel size matching that of the focus detection pixels. In addition, the image-capturing device, capable of generating image signals based upon the outputs from the image-capturing pixels, also has a focus detection function for detecting the focus adjustment state of the optical system based upon a shift amount indicating the extent of shift between the pair of image signals generated via the focus detection pixels through a method referred to as the split-pupil phase detection method.

SUMMARY OF THE INVENTION

However, at the image-capturing device described above, equipped with the image-capturing pixels and the focus detection pixels assuming structures different from each other, the outputs from the focus detection pixels may become saturated even if the outputs from the image-capturing pixels remain unsaturated over a given exposure period and, under such circumstances, focus detection may not be possible. For instance, while the exposure period may be shortened in order to ensure that the outputs from the focus detection pixels are not saturated during focus detection executed concurrently as the outputs from the image-capturing pixels are brought up on display at an electronic viewfinder, the shortened exposure period often results in a dark image due to insufficient image-capturing pixel output levels. Accordingly, the length of exposure period must be controlled so as to optimize the image-capturing pixel outputs. Under these circumstances, the outputs from the focus detection pixels may be allowed to become saturated, to lead to inability to execute focus detection.

According to the 1st aspect of the present invention, an image sensor comprises: a plurality of image-capturing pixels that, upon each receiving a partial light flux within a predetermined wavelength range, which is part of a photographic light flux used to form an optical image, output image signals corresponding to the optical image; a plurality of focus detection pixels that receive a pair of focus detection light fluxes in a wider wavelength range than the predetermined wavelength range and output a pair of focus detection signals; and a reduction unit that adjusts a signal level of the focus detection signals output from the plurality of focus detection pixels so as to ensure that the signal level of the focus detection signals, each output from one of the plurality of focus detection pixels under a given light receiving condition, is equal to or less than a signal level of the image signals each output from one of the plurality of image-capturing pixels under the given light receiving condition.

According to the 2nd aspect of the present invention, in the image sensor according to the 1st aspect, it is preferred that one focus detection light flux in the pair of focus detection light fluxes passes through a pupil area in a pair of pupil areas of an optical system and an other focus detection light flux in the pair of light fluxes passes through another pupil area in the pair of pupil areas; the plurality of focus detection pixels include a pixel column made up with a plurality of focus detection pixels that output a first focus detection signal string constituted with first focus detection signals upon receiving the one focus detection light flux and a pixel column made up with a plurality of focus detection pixels that output a second focus detection signal string constituted with second focus detection signals upon receiving the other focus detection light flux; and the first focus detection signal string and the second focus detection signal string contain phase information indicating a focus adjustment state of the optical system.

According to the 3rd aspect of the present invention, in the image sensor according to the 1st aspect, it is preferred that the plurality of image-capturing pixels each includes an image-capturing photoelectric conversion unit that converts the partial light flux received thereat to an image signal among the image signals; first image-capturing pixels among the plurality of image-capturing pixels each includes a first color filter through which a light flux in a first wavelength range set as the predetermined wavelength range is transmitted, and second image-capturing pixels among the plurality of image-capturing pixels each includes a second color filter through which a light flux in a second wavelength range different from the first wavelength range, set as the predetermined wavelength range, is transmitted; the plurality of focus detection pixels each includes a focus detection photoelectric conversion unit that converts a focus detection light flux received thereat in the focus detection light fluxes to a focus detection signal among the focus detection signals; and the wider wavelength range assumed for the focus detection light fluxes include the first wavelength range and the second wavelength range.

According to the 4th aspect of the present invention, in the image sensor according to the 3rd aspect, it is preferred that the reduction unit includes a light reducing unit that reduces an amount of light in the focus detection light flux received at the focus detection photoelectric conversion unit.

According to the 5th aspect of the present invention, in the image sensor according to the 4th aspect, it is preferred that the plurality of focus detection pixels each includes a micro-lens; the light reducing unit includes a light reducing filter disposed between the focus detection photoelectric conversion unit and the micro-lens; and the light reducing filter reduces an amount of light for a light flux in a substantially full visible light wavelength range.

According to the 6th aspect of the present invention, in the image sensor according to the 4th aspect, it is preferred that the plurality of focus detection pixels each includes a light shielding mask disposed substantially directly above the focus detection photoelectric conversion unit so as to block light other than the focus detection light flux and a micro-lens; the light reducing unit includes a light shielding member disposed between the micro-lens and the light shielding mask; and the light shielding member blocks part of the focus detection light flux so as to ensure that the part of the focus detection light flux is not received at the focus detection photoelectric conversion unit.

According to the 7th aspect of the present invention, in the image sensor according to the 4th aspect, it is preferred that the light reducing unit includes a beam splitter disposed at each of the plurality of focus detection pixels; and the beam splitter deflects part of the focus detection light flux toward outside of the plurality of focus detection pixels so as to ensure that part of the focus detection light flux is not received at the focus detection photoelectric conversion unit.

According to the 8th aspect of the present invention, in the image sensor according to the 4th aspect, it is preferred that the light reducing unit includes a multilayered body disposed at each of the plurality of focus detection pixels; and the multilayered body blocks part of the focus detection light flux so as to ensure that the part of the focus detection light flux is not received at the focus detection photoelectric conversion unit.

According to the 9th aspect of the present invention, in the image sensor according to the 1st aspect, it is preferred that the plurality of image-capturing pixels each includes an image-capturing photoelectric conversion unit that converts the partial light flux received thereat to an image signal among the image signals; the plurality of focus detection pixels each includes a focus detection photoelectric conversion unit that converts a focus detection light flux in the focus detection light fluxes received thereat to a focus detection signal among the focus detection signals; and the reduction unit includes a setting unit that selects a smaller setting for electrical charge storage time for photoelectric conversion of the focus detection light flux to the focus detection signal at the focus detection photoelectric conversion unit than a setting for electrical charge storage time for photoelectric conversion of the partial light flux to the image signal at the image-capturing photoelectric conversion unit.

According to the 10th aspect of the present invention, in the image sensor according to the 3rd aspect, it is preferred that first conversion characteristics with which the focus detection photoelectric conversion unit converts the focus detection light flux having been received thereat to the focus detection signal, are different from second conversion characteristics with which the image-capturing photoelectric conversion unit converts the partial light flux having been received thereat to the image signal; and the reduction unit ensures that the signal level of the focus detection signals output from the plurality of focus detection pixels under a given light receiving condition never exceeds the signal level of the image signals output from the plurality of image-capturing pixels under the given light receiving condition by varying the first conversion characteristics and the second conversion characteristics.

According to the 11th aspect of the present invention, in the image sensor according to the 10th aspect, it is preferred that the plurality of image-capturing pixels and the plurality of focus detection pixels each includes an output unit; the output unit included in each of the plurality of image-capturing pixels amplifies an electrical signal obtained through photoelectric conversion of the partial light flux executed at the image-capturing photoelectric conversion unit and outputs the amplified electrical signal as the image signal; the output unit included in each of the plurality of focus detection pixels amplifies an electrical signal obtained through photoelectric conversion of the focus detection light flux executed at the focus detection photoelectric conversion unit and outputs the amplified electrical signal as the focus detection signal; and the reduction unit ensures that the signal level of the focus detection signals output from the plurality of focus detection pixels under a given light receiving condition never exceeds the signal level of the image signals output from the plurality of image-capturing pixels under the given light receiving condition by setting a lower amplification factor at the output unit included in each of the plurality of focus detection pixels relative to an amplification factor set at the output unit included in each of the plurality of image-capturing pixels.

According to the 12th aspect of the present invention, in the image sensor according to the 10th aspect, it is preferred that the reduction unit ensures that the signal level of the focus detection signals output from the plurality of focus detection pixels under a given light receiving condition never exceeds the signal level of the image signals output from the plurality of image-capturing pixels under the given light receiving condition by setting a lower quantum efficiency level for the focus detection photoelectric conversion unit relative to a quantum efficiency level set for the image-capturing photoelectric conversion unit.

According to the 13th aspect of the present invention, an image-capturing device, comprises: an image sensor according to the 1st aspect; an image generation unit that generates image data related to the optical image based upon outputs from the plurality of image-capturing pixels; and a focus detection unit that detects a focus adjustment state of an optical system based upon outputs from the plurality of focus detection pixels.

According to the 14th aspect of the present invention, an image sensor, comprises: a plurality of image-capturing pixels that, upon each receiving a partial light flux within a predetermined wavelength range, which is part of a photographic light flux used to form an optical image, output image signals corresponding to the optical image; and a plurality of focus detection pixels that receive a pair of focus detection light fluxes in a wider wavelength range than the predetermined wavelength range and output a pair of focus detection signals. The plurality of image-capturing pixels each includes an image-capturing photoelectric conversion unit that converts the partial light flux received thereat to an image signal among the image signals; the plurality of focus detection pixels each includes a focus detection photoelectric conversion unit that converts a focus detection light flux received thereat in the focus detection light fluxes to a focus detection signal among the focus detection signals; and a signal level of the focus detection signal output from each of the plurality of focus detection pixels under a given light receiving condition is adjusted so as to be lower than a signal level of the image signal output from each of the plurality of image-capturing pixels under the given light receiving condition by ensuring that first conversion characteristics with which the focus detection light flux is converted to the focus detection signal via the focus detection photoelectric conversion unit are different from second conversion characteristics with which the partial light flux is converted to the image signal via the image-capturing photoelectric conversion unit.

According to the 15th aspect of the present invention, in the image sensor according to the 14th aspect, it is preferred that the plurality of image-capturing pixels and the plurality of focus detection pixels each includes an output unit; the output unit included in each of the plurality of image-capturing pixels amplifies an electrical signal obtained through photoelectric conversion of the partial light flux executed at the image-capturing photoelectric conversion unit and outputs the amplified electrical signal as the image signal; the output unit included in each of the plurality of focus detection pixels amplifies an electrical signal obtained through photoelectric conversion of the focus detection light flux executed at the focus detection photoelectric conversion unit and outputs the amplified electrical signal as the focus detection signal; the first conversion characteristics include a first amplification factor set for the output unit included in each of the plurality of focus detection pixels and the second conversion characteristics include a second amplification factor set for the output unit included in each of the plurality of image-capturing pixels; and the first amplification factor is lower than the second amplification factor.

According to the 16th aspect of the present invention, in the image sensor according to the 14th aspect, it is preferred that the first conversion characteristics include a first quantum efficiency level assumed for the focus detection photoelectric conversion unit and the second conversion characteristics include a second quantum efficiency level assumed for the image-capturing photoelectric conversion unit; and the first quantum efficiency level is lower than the second quantum efficiency level.

According to the 17th aspect of the present invention, an image-capturing device, comprises: an image sensor according to the 14th aspect; an image generation unit that generates image data related to the optical image based upon outputs from the plurality of image-capturing pixels; and a focus detection unit that detects a focus adjustment state of an optical system based upon outputs from the plurality of focus detection pixels.

BRIEF DESCRIPTION OF THE DRAWINGS

FIG. 18 shows a structure that may be adopted in the focus detection pixels at an image sensor achieved in another embodiment.

FIG. 19 shows focus detection pixels in a sectional view.

FIG. 30 shows focus detection pixels in a sectional view.

DESCRIPTION OF PREFERRED EMBODIMENTS

Figure 1:
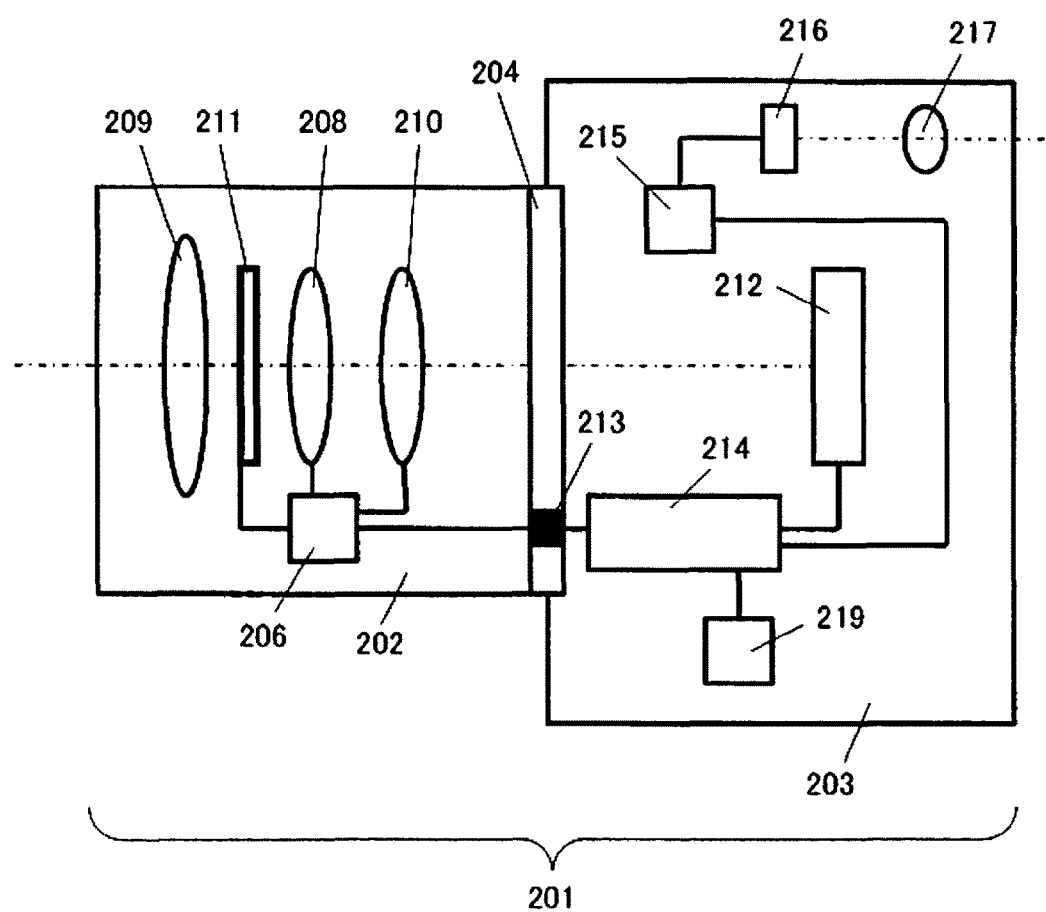
FIG. 1 is a sectional side view showing the structure of a digital still camera used in conjunction with interchangeable lenses, which is equipped with the image sensor achieved in an embodiment.

The image sensor and the image-capturing device achieved in an embodiment of the present invention are now described. FIG. 1 shows in a sectional side view the structure of a digital still camera used in conjunction with interchangeable lenses, which is equipped with the image sensor achieved in the embodiment. A digital still camera 201 in the embodiment includes an interchangeable lens 202 and a camera body 203. The interchangeable lens 202 among various interchangeable lenses is mounted at the camera body 203 via a mount unit 204.

The interchangeable lens 202 includes a lens 209, a zooming lens 208, a focusing lens 210 an aperture 211 and a lens drive control device 206. The lens drive control device 206, constituted with a microcomputer, a memory, a drive control circuit and the like, none shown engages in communication with a body drive control device 214 to be detailed later to transmit lens information to the body drive control device 214 and receive camera information from the body drive control device 214, as well as executing drive control for focus adjustment at the focusing lens 210 and for opening diameter adjustment at the aperture 211 and detecting the states of the zooming lens 208, the focusing lens 210 and the aperture 211. The aperture 211 forms an opening, the diameter of which can be adjusted, around the optical axis for purposes of light amount adjustment and adjustment of the extent of blurring.

An image sensor 212, the body drive control device 214, a liquid crystal display element drive circuit 215, a liquid crystal display element 216, an eyepiece lens 217, a memory card 219 and the like are disposed at the camera body 203. Image-capturing pixels are two-dimensionally arrayed at the image sensor 212 and focus detection pixels are also built into the image sensor over areas corresponding to focus detection positions. The image sensor 212 is to be described in detail later.

The body drive control device 214, constituted with a microcomputer, a memory, a drive control circuit and the like, processes and records the image signals, executes control for camera operations and the like, in addition to repeatedly executing drive control for the image sensor 212, reading out the image signals and the focus detection signals, executing focus detection calculation based upon the focus detection signals and executing focus adjustment for the interchangeable lens 202. The body drive control device 214 also engages in communication with the lens drive control device 206 via an electrical contact point 213 to receive the lens information and transmit the camera information (indicating the defocus amount, the aperture value and the like).

The liquid crystal display element 216 functions as an electronic viewfinder (EVF). A through image provided by the image sensor 212, brought up on display at the liquid crystal display element 216 by the liquid crystal display element drive circuit 215, can be observed by the photographer via the eyepiece lens 217. The memory card 219 is an image storage medium in which an image captured by the image sensor 212 is stored.

As a light flux (photographic light flux) having passed through the interchangeable lens 202 passes through a filter to be detailed later, a partial light flux corresponding to a predetermined wavelength range is obtained and a subject image is formed with the partial light flux on the light-receiving surface of the image sensor 212. The subject image undergoes photoelectric conversion at the image sensor 212 and subsequently, image signals and focus detection signals are transmitted to the body drive control device 214.

The body drive control device 214 calculates the defocus amount indicating the extent of defocusing based upon focus detection signals output from focus detection pixels at the image sensor 212 and transmits this defocus amount to the lens drive control device 206. In addition, the body drive control device 214 generates image data by processing the image signals provided from the image sensor 212 and stores the image data thus generated into the memory card 219. It also provides through image signals from the image sensor 212 to the liquid crystal display element drive circuit 215 so as to bring up a through image on display at the liquid crystal display element 216. Moreover, the body drive control device 214 provides aperture control information to the lens drive control device 206 to enable control of the opening of the aperture 211.

The lens drive control device 206 updates the lens information in correspondence to the current focusing state, zooming state and aperture setting state, F number for the maximum aperture and the like. More specifically, the lens drive control device 206 detects the positions of the zooming lens 208 and the focusing lens 210 and the aperture value set for the aperture 211, and calculates correct lens information based upon the lens positions and the aperture value. Alternatively, it may select the lens information corresponding to the lens positions and the aperture value from a lookup table prepared in advance.

In addition, the lens drive control device 206 calculates a lens drive quantity indicating the extent to which the lens is to be driven based upon the defocus amount having been received and drives the focusing lens 210 to a focusing position based upon the lens drive quantity. The lens drive control device 206 also drives the aperture 211 in correspondence to the aperture value it has received.

Figure 2:
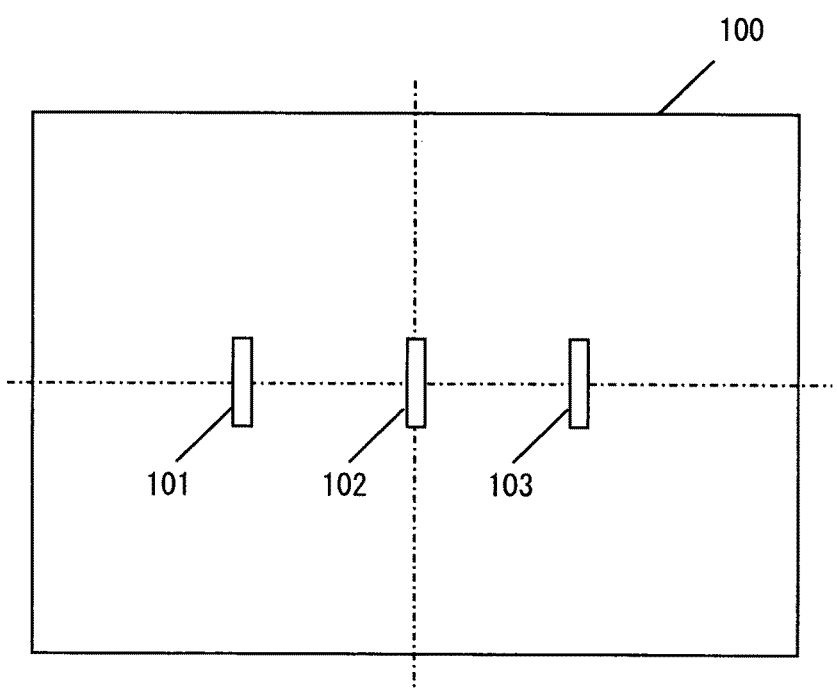
FIG. 2 shows focus detection positions that may be set on the photographic image plane of the interchangeable lens.

The focus detection positions set on the photographic image plane, at which an image is sampled on the photographic image plane of the interchangeable lens 202 for focus detection via focus detection pixel columns (focus detection areas, focus detection positions) at the image sensor 212 to be detailed later, are shown in FIG. 2. In the example presented in figure, three focus detection areas 101 through 103 are set at the center on the left side and on the right side of a rectangular photographic image plane 100. The rectangular focus detection areas 101 through 103, ranging along a vertical direction at the photographic image plane, each includes focus detection pixels disposed linearly along the longer side of the focus detection area.

Figure 3:
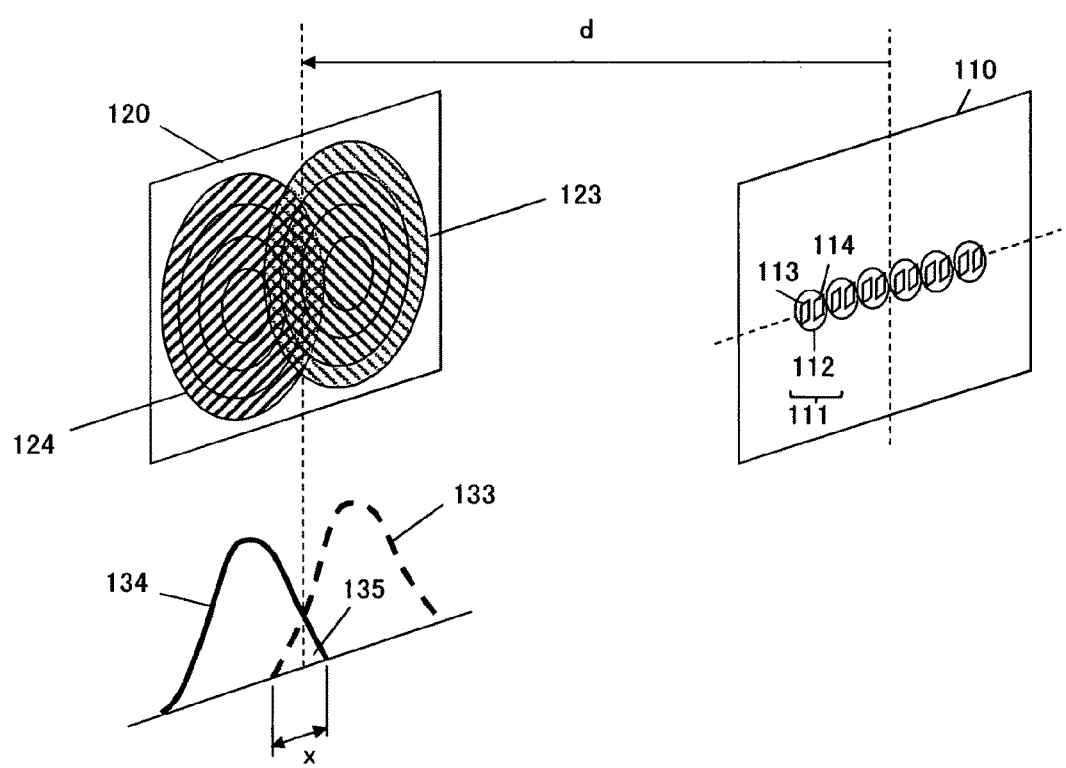
FIG. 3 illustrates the principle of the split-pupil phase detection method.

Before the structure of the image sensor 212 is described in detail, the principle of the split-pupil phase detection method disclosed in Japanese Laid Open Patent Publication No. H1-216306 is explained in reference to FIG. 3.

On an image-capturing surface 110, a plurality of focus detection pixels 111 are arrayed. The focus detection pixels 11 are each constituted with a micro-lens 112 and a pair of photoelectric conversion units 113 and 114. The pair of photoelectric conversion units 113 and 114 are projected via the micro-lens 112 onto a focus detection pupil plane 120 set to the front of the image-capturing surface 110 over a distance d from the image-capturing surface 110 and thus, a pair of focus detection pupils 123 and 124 are formed. In other words, the light flux forming the focus detection pupil 123, which is part of the light flux passing through the focus detection pupil plane 120 set apart from the image-capturing surface 110 over the distance d along the forward direction, is received at the photoelectric conversion unit 113 of the focus detection pixel 111, whereas the light flux forming the focus detection pupil 124, which is part of the light flux passing through the focus detection pupil plane 120 set apart from the image-capturing surface 110 over the distance d along the forward direction, is received at the photoelectric conversion unit 114 of the focus detection pixel 111. The relative shift amount (phase difference, image shift amount) representing the extent of offset manifested by the image signals from the photoelectric conversion units 113 at the focus detection pixels 111 in the array and the image signals from the photoelectric conversion units 114 at the focus detection pixels 111 in the array changes in correspondence to the focus adjustment state of an optical system through which an image is formed on the image-capturing surface. Accordingly, the focus adjustment state of the optical system can be detected by determining the shift amount through calculation processing executed on the pairs of image signals generated via the focus detection pixels.

The pair of focus detection pupils 123 and 124 do not assume distributions that would be achieved simply by projecting the pair of photoelectric conversion units 113 and 114, but rather they assume distributions with shallow verges due to blurring attributable to the diffraction of light that occurs in correspondence to the diameter of the openings at the micro-lenses. The pair of focus detection pupil distributions 133 and 134 in FIG. 3 are obtained by scanning the pair of focus detection pupils 123 and 124 along the direction in which the focus detection pupils 123 and 124 are set side-by-side with a slit ranging along a direction perpendicular to the direction in which the focus detection pupils are set side-by-side. Due to the effect of the diffraction mentioned above, the pair of focus detection pupil distributions 133 and 134 overlap each other over a superimposed area 135. When the ratio of the superimposed area 135 to the entire focus detection distribution area 133 or 134 is higher, the pair of focus detection pupils 123 and 124 are separated from each other less completely, resulting in lowered focus detection performance. In particular, when the aperture F number at the optical system is larger and thus the aperture opening diameter is smaller, the pair of light fluxes having been transmitted through the optical system will enter each focus detection pixel 111 through areas near the optical axis within the pair of focus detection pupils 123 and 124. Since the pair of light fluxes to be used in the focus detection are not separated from each other completely in this situation, the focus detection performance is bound to be compromised or in some cases, focus detection may become impossible.

Table 1 indicates the relationship between the aperture F number at the optical system and the diameter of the expanse of the point image distribution attributable to diffraction, determined based upon an Airy disk expression ((point image diameter=1.22·2·(wavelength)·(F number)) with the wavelength at 500 nm). Since the point image diameter calculated for a bright optical system (with a small aperture F number) is in the order of μm, an improvement in resolution can be achieved by setting the size of the image-capturing pixels equal to or less than the point image diameter.

TABLE 1

|  | Aperture F number | | | | | |
|---|---|---|---|---|---|---|
|  | 1.4 | 2 | 2.8 | 4 | 5.6 | 8 |
| Point image diameter | 1.7 | 2.4 | 3.4 | 4.9 | 6.8 | 9.8 |

However, as explained earlier, when a smaller pixel size is assumed, the influence of the diffraction increases, and since the focus detection pupils are separated less completely, the focus detection performance is bound to be compromised.

Table 2 indicates the relationship between the pixel size (the opening diameter D of round micro-lenses) and the F number corresponding to the superimposed area 135 and obtained by dividing the distance d in FIG. 3 by the dimension x of the superimposed area 135 where the pair of focus detection pupil distributions overlap each other, determined based upon an Airy disk expression ((F=D/(1.22·2·(wavelength)) with the wavelength set at 500 nm). When the pixel size is equal to or less than 7 μm, the F number corresponding to the superimposed area 135 is equal to or less than 5.7.

TABLE 2

|  | pixel size | | | | | |
|---|---|---|---|---|---|---|
|  | 7 | 6 | 5 | 4 | 3 | 2 |
| superimposed area where the focus detection pupil distributions overlap | 5.7 | 4.9 | 4.1 | 3.3 | 2.5 | 1.6 |

A maximum aperture number of F 5.6 is often set for interchangeable lenses used in cameras. If the pixel size of the focus detection pixels used in conjunction with such an interchangeable lens is set to 7 μm or less, the pair of focus detection light fluxes passing through the F 5.6 opening will be superimposed upon one another over their entirety, which is bound to manifest a discernible decrease in the level of focus detection performance. If focus detection pixels with the pixel size thereof equal to or less than 4 μm are used, the pair of focus detection light fluxes passing through an opening corresponding to an F number of approximately F 2.8 will be superimposed upon one another over their entirety and the focus detection performance will be lowered even more markedly.

Figure 4:
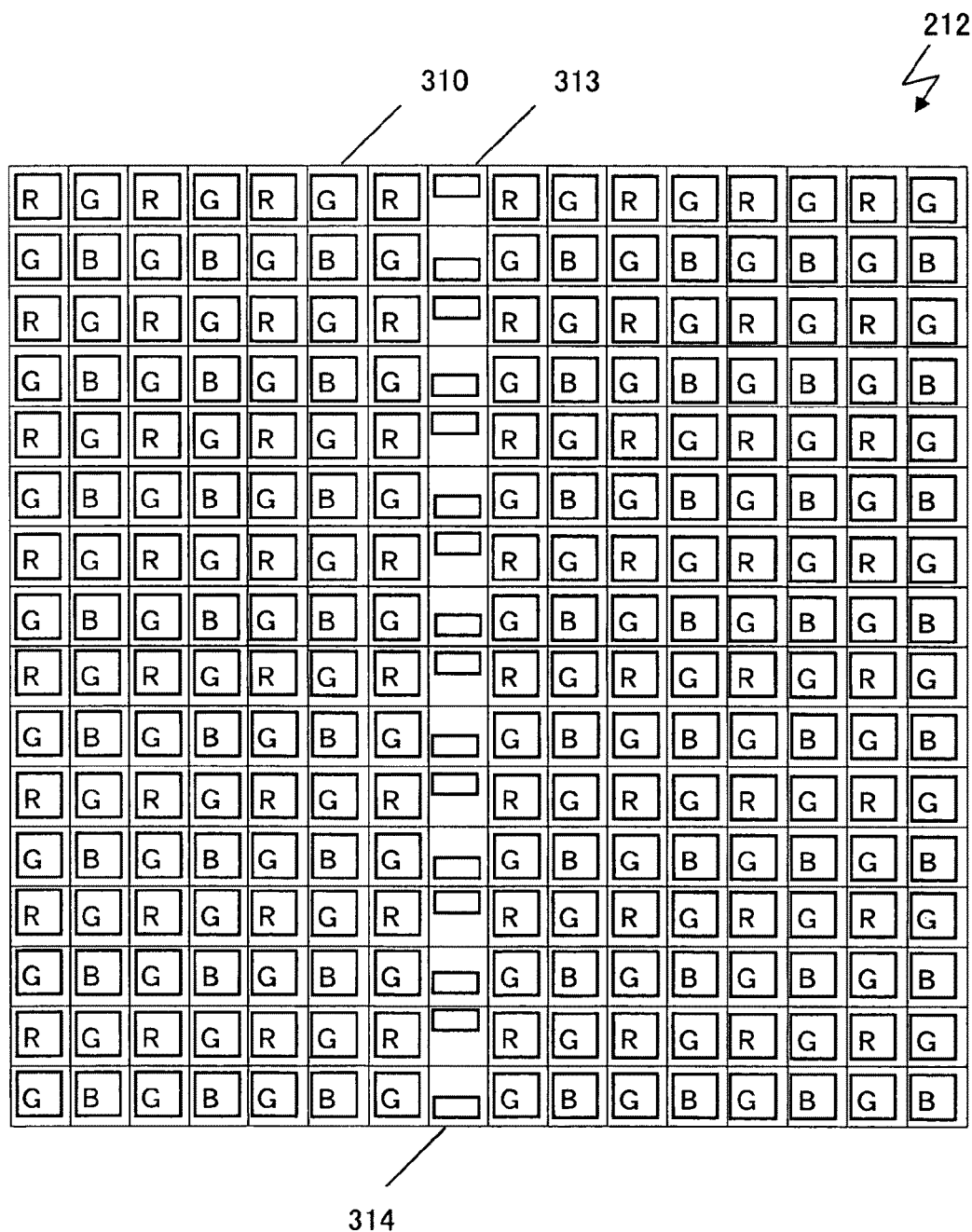
FIG. 4 shows in detail the structure of the image sensor in a partial enlargement of a front view.

FIG. 4 is a front view showing in detail the structure adopted in the image sensor 212. The figure shows an area around the focus detection area 101 at the image sensor 212 in an enlargement. At the image sensor 212, image-capturing pixels 310 are disposed in a dense square grid array. The image-capturing pixels 310, which include red pixels (R), green pixels (G) and blue pixels (B), are disposed in conformance to the Bayer array arrangement rules. At the position corresponding to the focus detection area 101, a focus detection pixel 313 and a focus detection pixel 314, assuming a pixel size matching that of the image-capturing pixels and engaged in focus detection, are disposed alternately to each other in a reiterative pattern along a straight line extending in the vertical direction, upon which a green pixel and a blue pixel would otherwise be successively disposed alternately to one another.

Figure 5:
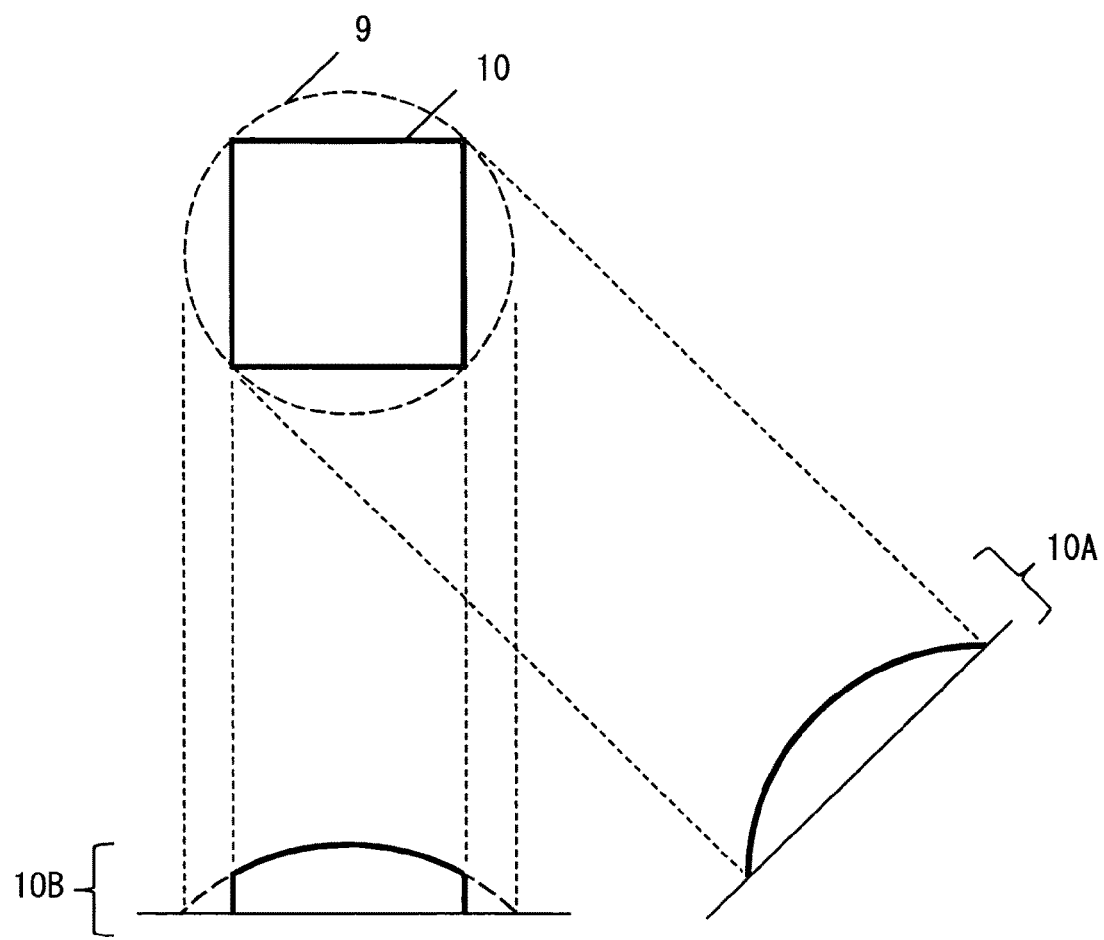
FIG. 5 shows the shape assumed by the micro-lenses included in the image-capturing pixels and the focus detection pixels.

FIG. 5 shows a shape that may be assumed for the micro-lenses in the image-capturing pixels and the focus detection pixels. The micro-lens 10 in the figure is achieved by cutting out a square lens piece corresponding to the pixel size from a round micro-lens 9, the size of which is greater than the pixel size. A section 10A taken through a diagonal passing through the optical axis of the micro-lens 10 and a section 10B taken through a horizontal line passing through the optical axis of the micro-lens 10 achieve the shapes indicated in FIG. 5.

By forming the micro-lens in a rectangular (square) shape as described above, the extent of the widening of the focus detection pupils, attributable to the diffraction effect mentioned earlier, can be reduced and ultimately, the level of focus detection performance can be improved. However, since the opening at the micro-lens is bound to be greater than that of a round lens corresponding to the matching pixel size, the level of the output from a focus detection pixel with the rectangular micro-lens will be greater.

The image-capturing pixels and the focus detection pixels both assume a pixel size of 3μ. It is to be noted that although not shown, structures similar to that shown in FIG. 4 are also assumed around the focus detection areas 102 and 103.

Figure 6A:
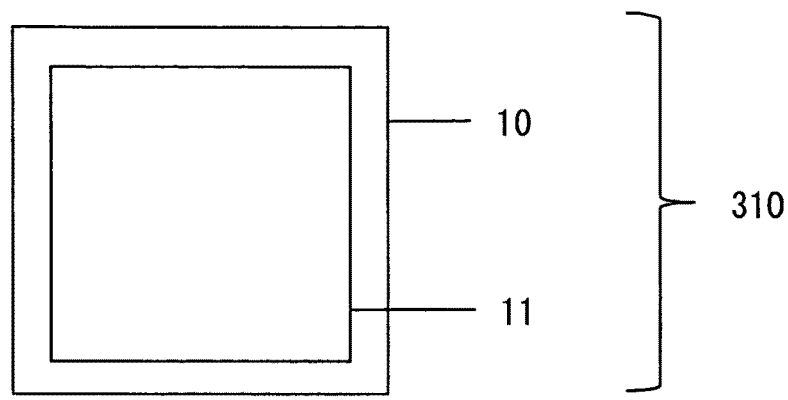
FIGS. 6A, 6B and 6C show an image-capturing pixel and focus detection pixels in front views.
Figure 7:
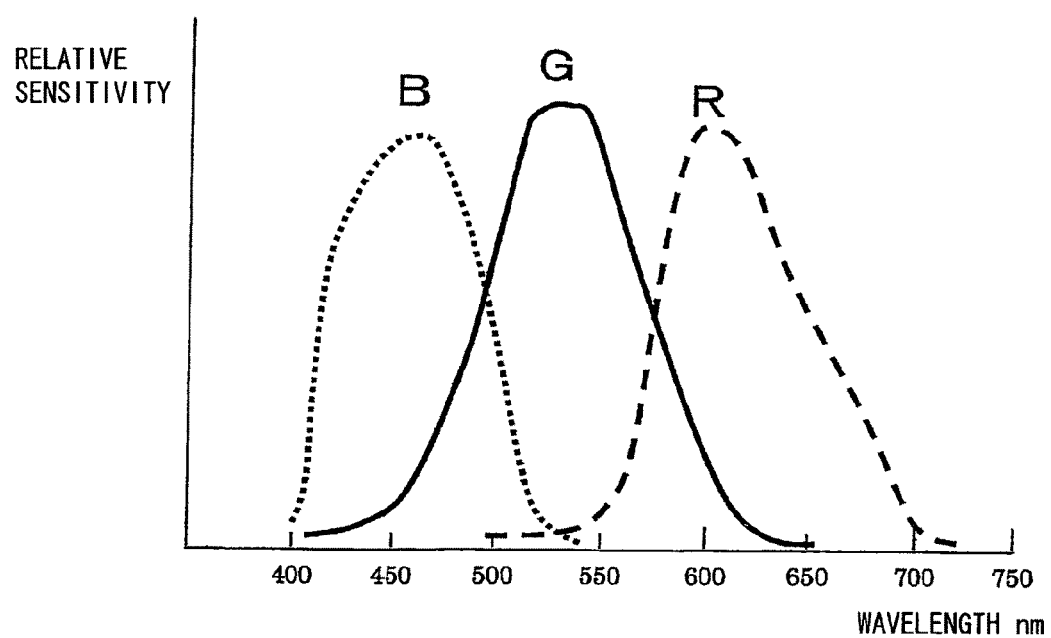
FIG. 7 shows the spectral characteristics of the green pixels, the red pixels and the blue pixels.

As shown in FIG. 6A, the image-capturing pixels 310 each includes a rectangular micro-lens 10, a photoelectric conversion unit 11, the light receiving area of which is limited by a light shielding mask to be detailed later, and a color filter (not shown). The color filters at the image-capturing pixels include red (R) filters, green (G) filters and blue (B) filters, and their spectral sensitivity characteristics are as shown in FIG. 7. At the image sensor 212, the image-capturing pixels 310 each equipped with a color filter are disposed in a Bayer array. The photoelectric conversion unit 11 of a given image-capturing pixel 310 equipped with a color filter in a specific color, having received a partial light flux in a specific wavelength range corresponding to the particular color filter outputs an image signal by executing a pixel signal output operation, the details of which are to be described later.

Figure 6B:
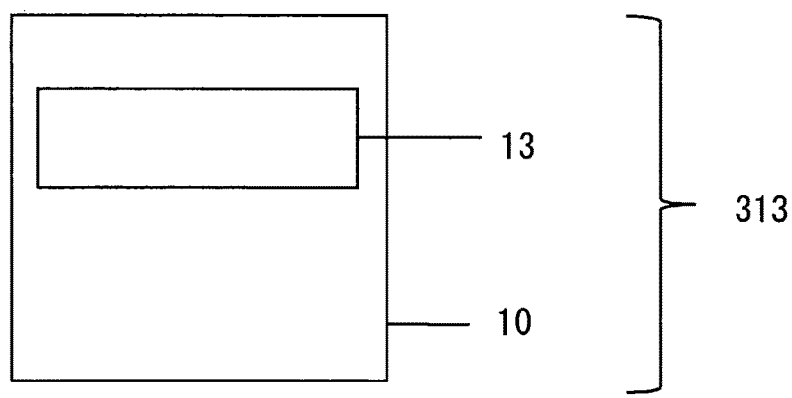

The focus detection pixels 313 each includes a rectangular micro-lens 10, a photoelectric conversion unit 13, the light receiving area of which is limited by a light shielding mask to be detailed later and an ND filter (not shown). The photoelectric conversion unit 13 with the light receiving area thereof limited by the light shielding mask assume a rectangular shape, as shown in FIG. 6B. In addition, the focus detection pixels 314 each includes a rectangular micro-lens 10, a photoelectric conversion unit 14, the light receiving area of which is limited by a light shielding mask to be detailed later, and an ND filter (not shown). The photoelectric conversion unit 14 with the light receiving area thereof limited by a light shielding mask having a smaller opening than the light shielding mask at the image-capturing pixel 310 assumes a rectangular shape. When the micro-lenses 10 at a focus detection pixel 313 and a focus detection pixel 314 are set one on top of the other, their photoelectric conversion unit 13 and 14, with the light receiving areas thereof limited by the light shielding masks, are set side-by-side along the vertical direction.

Figure 9:
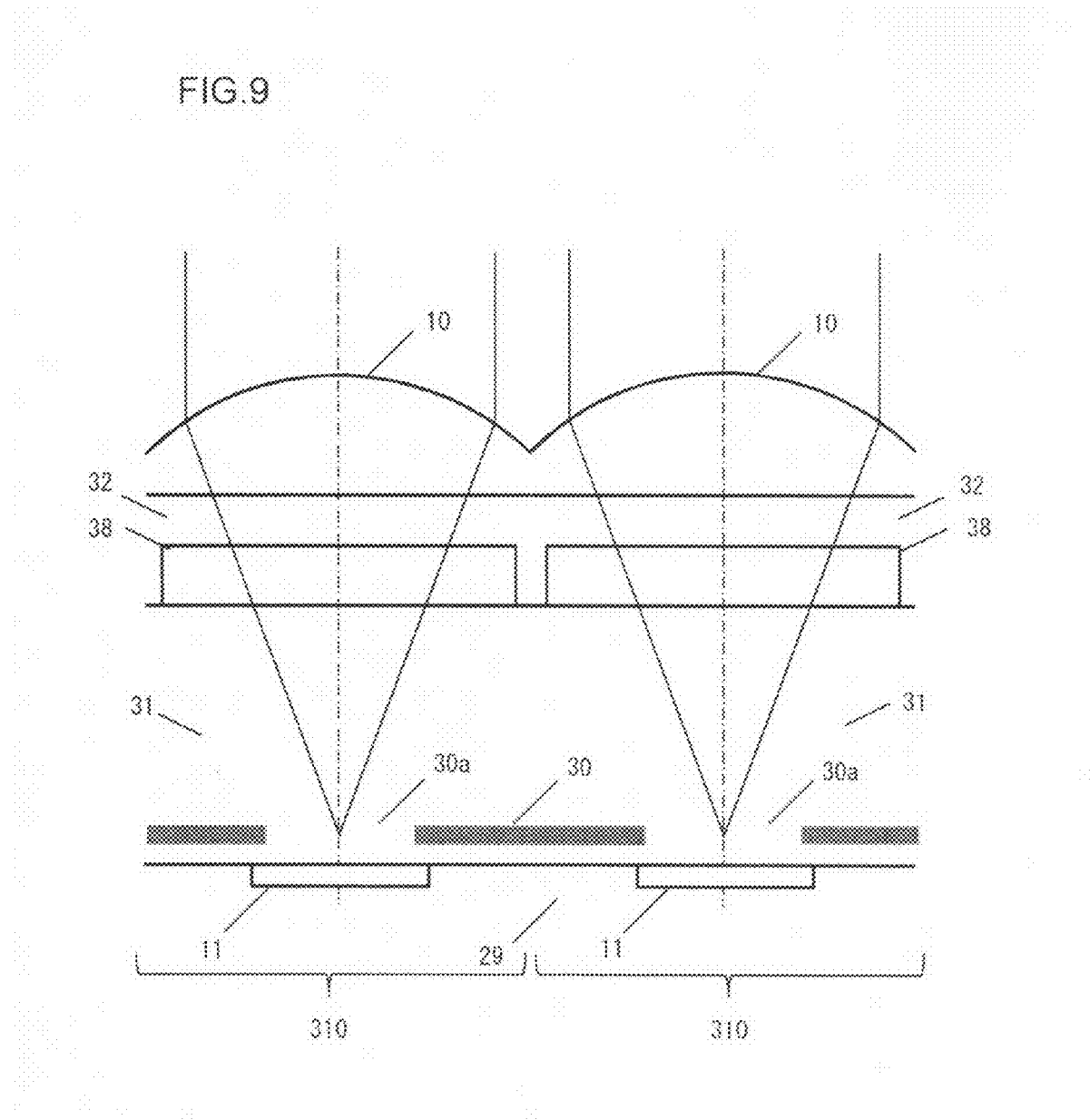
FIG. 9 shows image-capturing pixels in a sectional view.

FIG. 9 shows image-capturing pixels 310 in a sectional view. A light shielding mask 30 is formed above and in close proximity to the photoelectric conversion units 11 engaged in image-capturing operation at the image-capturing pixels 310 and the photoelectric conversion units 11 each receive light having passed through an opening 30a. Above the light shielding mask 30, a leveling layer 31 is formed and color filters 38 are formed above the leveling layer. Above the color filters, a leveling layer 32 is formed and micro-lenses 10 are formed above the leveling layer 32. The shape of each opening 30a is projected forward via the corresponding micro-lens 10. The photoelectric conversion units 11 are formed on a semiconductor substrate 29.

Figure 10:
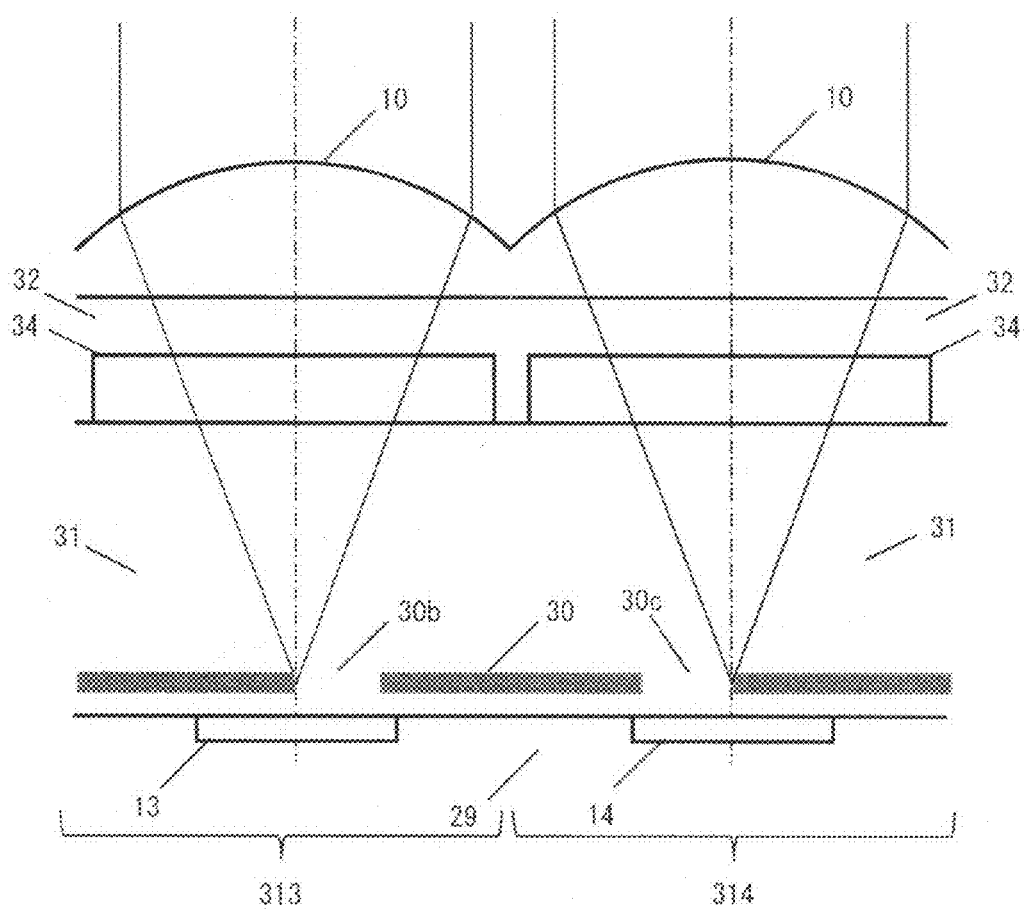
FIG. 10 shows focus detection pixels in a sectional view.

FIG. 10 shows focus detection pixels 313 and 314 in a sectional view. A light shielding mask 30 is formed above and in close proximity to the photoelectric conversion units 13 and 14 engaged in focus detection at the focus detection pixels 313 and 314, and the photoelectric conversion units 13 and 14 respectively receive light having passed through openings 30b and 30c at the light shielding mask 30. A leveling layer 31 is formed above the light shielding mask 30 and above the leveling layer 31, ND (neutral density) filters to function as light reducing filters 34 are formed. A leveling layer 32 is formed above the ND filters 34 and micro-lenses 10 are formed above the leveling layer 32. The shapes of the openings 30b and 30c are projected forward via the micro-lenses 10. The photoelectric conversion units 13 and 14 are formed on the semiconductor substrate 29.

Figure 8:
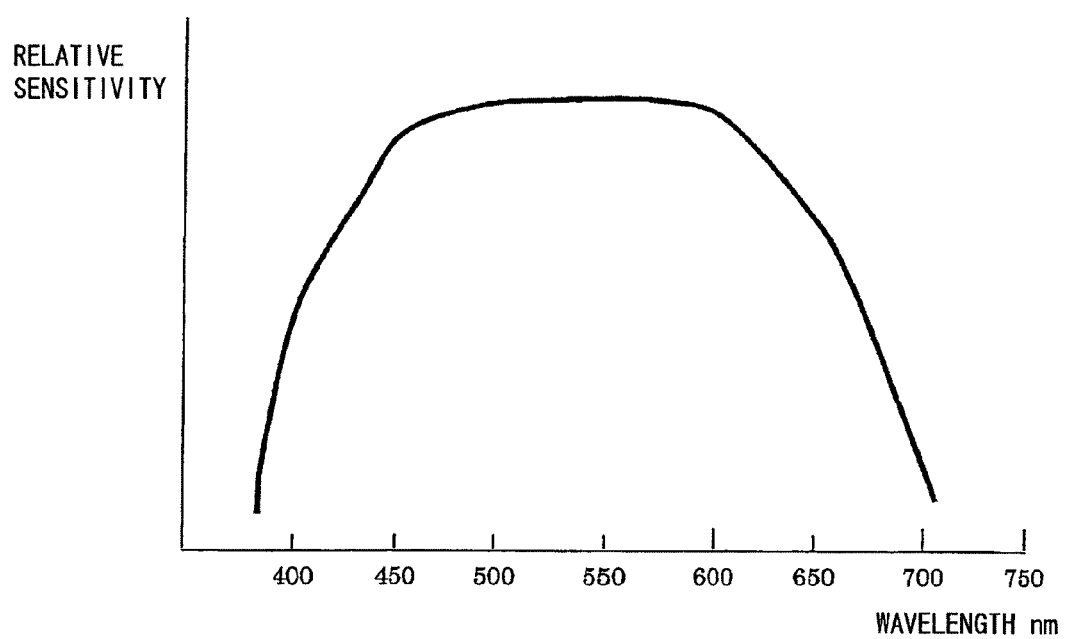
FIG. 8 shows the spectral characteristics of the focus detection pixels.

As described above, no color filters are disposed at the focus detection pixels 313 and 314 so as to enable focus detection for all colors and instead, an ND filter 34, through which the amount of incoming light is reduced, is disposed at each focus detection pixel. The spectral characteristics of the focus detection pixels are shown in FIG. 8. Namely, the spectral sensitivity characteristics are similar to the sum of the spectral sensitivity characteristics of the green pixels, the red pixels and the blue pixels shown in FIG. 7, which indicate sensitivity in a light wavelength range that includes the light wavelength ranges corresponding to the sensitivity characteristics of all the pixels, i.e., the green pixels, the red pixels and the blue pixels. The density of the ND filters 34 is set so that when the image sensor 212 is irradiated with white light, the outputs from the focus detection pixels 313 and 314 assume a level equal to or less than ¾ (75%) of the output level at the green pixels among the image-capturing pixels 310. This is achieved through the function of the ND filters 34 described below.

The first function of the ND filters 34 is as follows. As described earlier, the color filters 38 with the spectral sensitivity characteristics shown in FIG. 7 are present at the image-capturing pixels 310. Accordingly, the amounts of light entering the photoelectric conversion units 11 are reduced via the color filters 38. At the focus detection pixels 313 and 314 not equipped with color filters, the amounts of light entering the photoelectric conversion units are not reduced and, for this reason, the output level at the focus detection pixels 313 and 314 may exceed the output level at the image-capturing pixels 310. The ND filters 34, which reduce the amount of light entering the photoelectric conversion units 13 and 14, are disposed at the focus detection pixels in order to prevent the output level at the focus detection pixels from exceeding the output level at the image-capturing pixels. Thus, the signal level of the focus detection signals output from the focus detection pixels 313 and 314 is adjusted to a level lower than the signal level of the image signals output from the image-capturing pixels 310.

The second function of the ND filters 34 is as follows. Namely, with the ND filters 34, it is ensured that even when vignetting of the focus detection light fluxes occurs at an area on the image plane assuming a significant image height (the focus detection area 102 or 103), the balance between the output levels at the pair of focus detection pixels 313 and 314 is disrupted and the output level at one focus detection pixel rises above the output level at the other focus detection pixel, the raised output level still does not exceed the output level at the green pixels among the image-capturing pixels 310.

The focus detection pixels 313 and 314 are disposed in a column that would otherwise be occupied by B pixels and G pixels among the image-capturing pixels 310 according to the Bayer array arrangement rules. Such a positional arrangement is assumed for the focus detection pixels 313 and 314, since the characteristics of human visual perception are such that any interpolation error that may occur when obtaining image signals corresponding to blue pixels at the positions occupied by the focus detection pixels 313 and 314 through interpolation processing will be less noticeable than the interpolation error occurring when obtaining image signals corresponding to red pixels.

The image-capturing pixels 310 are designed so that their shape allows the light flux passing through the exit pupil of the fastest interchangeable lens (e.g., F 1.0) to be received in its entirety at the photoelectric conversion units 11 via the micro-lenses 10. In addition, the focus detection pixels 313 and 314 are designed so that the pair of focus detection light fluxes passing through a pair of specific areas at the exit pupil of the interchangeable lens are respectively received at the photoelectric conversion units 13 and 14 via the corresponding micro-lenses 10.

Figure 11:
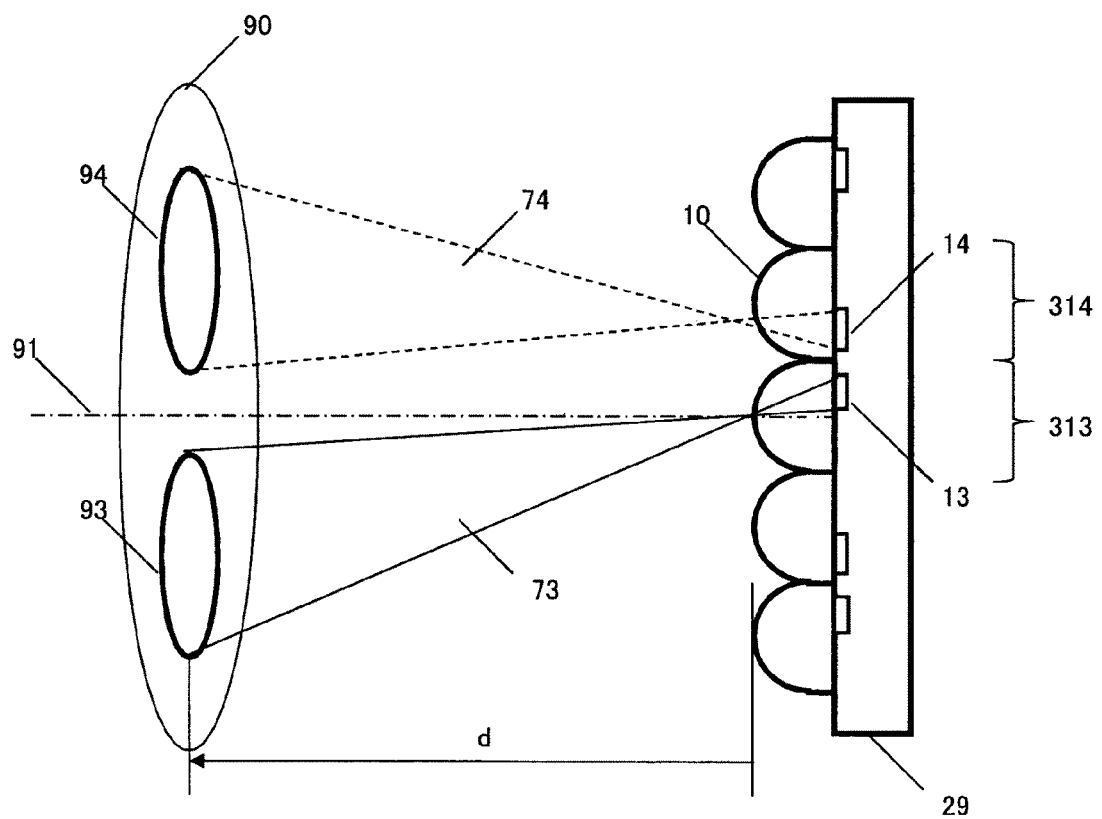
FIG. 11 shows a structure that may be adopted in a focus detection optical system that executes focus detection via micro-lenses through the split-pupil phase detection method.

FIG. 11 shows the structure of a focus detection optical system used to detect the focus adjustment state via micro-lenses through the split-pupil phase detection method. It is to be noted that the focus detection pixels are shown in an enlargement. An exit pupil 90 in FIG. 11 is set over a distance d along the frontward direction from the micro-lenses disposed at the predetermined image forming plane of the interchangeable lens 202 (see FIG. 1). The distance d is determined in correspondence to the curvature of the micro-lenses, the refractive index of the micro-lenses, the distance between the micro-lenses and the photoelectric conversion units and the like, and is referred to as a focus detection pupil distance in this description. FIG. 11 also shows an optical axis 91 of the interchangeable lens, micro-lenses 10, photoelectric conversion units 13 and 14, focus detection pixels 313 and 314, a photographic light flux 71 and focus detection light fluxes 73 and 74.

A focus detection pupil 93 is formed as the area of the opening 30b is projected via the micro-lens 10. Likewise, a focus detection pupil 94 is formed as the area of the opening 30c is projected via the micro-lens 10. While the focus detection pupils 93 and 94 are shown in FIG. 11 as clearly defined areas for easier reference, the projected images of the openings 30b and 30c will be enlarged and also their shapes will, in fact, be blurred due to diffraction.

While FIG. 11 schematically illustrates five focus detection pixels present adjacent to the photographic optical axis, the photoelectric conversion units at the other focus detection pixels and the image-capturing pixels in the focus detection area 101, and at the focus detection pixels in the focus detection areas 102 and 103 located toward the periphery of the image plane are all designed so as to receive light fluxes arriving at the respective micro-lenses from the corresponding focus detection pupils 93 and 94. The focus detection pixels are arrayed in a direction matching the direction in which the pair of focus detection pupils are set side-by-side, i.e., the direction along which the pair of photo electric conversion units are set side-by-side.

The micro-lenses 10 are disposed near the predetermined image forming plane of the interchangeable lens 202 (see FIG. 1) and the shapes of the openings 30b and 30c present in close proximity to the photoelectric conversion units 13 and 14 are projected via the micro-lenses 10 onto the exit pupil 90 set apart from the micro-lenses 10 by the focus detection pupil distance d. The shapes of the openings thus projected define the focus detection pupils 93 and 94.

The photoelectric conversion unit 13 outputs a signal corresponding to the intensity of an image formed on the micro-lens 10 of the focus detection pixel 313 with the focus detection light flux 73 having passed through the focus detection pupil 93 and having advanced toward the micro-lens 10. In addition, the photoelectric conversion unit 14 outputs a signal corresponding to the intensity of an image formed on the micro-lens 10 of the focus detection pixel 314 with the focus detection light flux 74 having passed through the focus detection pupil 94 and having advanced toward the micro-lens 10.

By linearly disposing the two types of focus detection pixels structured as described above in large quantities and integrating the outputs from the photoelectric conversion units at the individual pixels into output groups each corresponding to one of the two focus detection pupils 93 and 94, information related to the intensity distribution of the pair of images formed on the pixel column with the individual focus detection light fluxes passing through the focus detection pupil 93 and the focus detection pupil 94 is obtained. Image shift detection calculation processing (correlation calculation processing, phase detection processing), to be detailed later, is subsequently executed by using the information thus obtained so as to detect the extent of image shift between the pair of images through the split-pupil phase detection method. Then, by executing a conversion operation on the image shift amount in correspondence to the proportional relation of the focus detection pupil distance to the distance between the gravitational centers of the pair of focus detection pupils, the deviation (defocus amount) of the current imaging plane (the imaging plane at the focus detection position corresponding to the position assumed by the micro-lens array on the predetermined imaging plane), relative to the predetermined imaging plane, is calculated.

Figure 12:
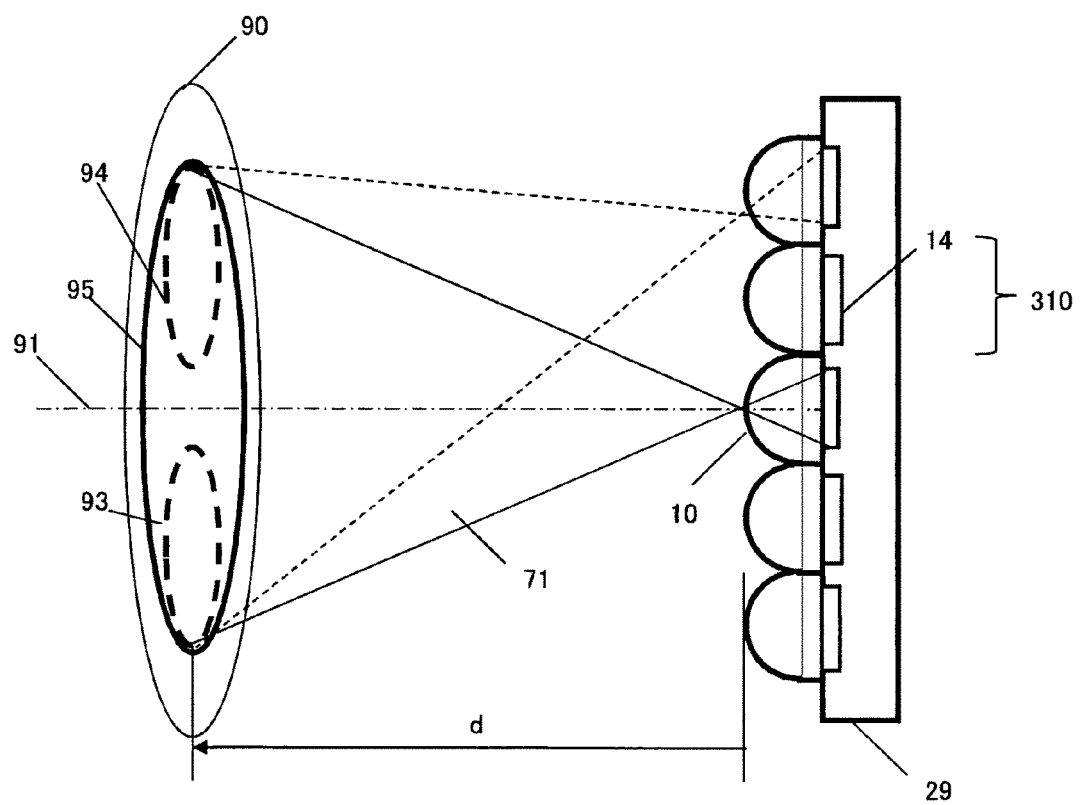
FIG. 12 illustrates how photographic light fluxes are received at image-capturing pixels.

FIG. 12, which is to be referred to in comparison to FIG. 11, shows photographic light fluxes received at image-capturing pixels 310 of the image sensor 212 shown in FIG. 4. An explanation of any illustrated items identical to those in FIG. 11 is omitted.

The image-capturing pixels 310 are each constituted with a micro-lens 10, a photoelectric conversion unit 11 disposed behind the micro-lens and the like. The shape of the opening 30a (see FIG. 9) present in close proximity to the photoelectric conversion unit 11 is projected via the micro-lens 10 onto the exit pupil 90 set apart by the focus detection pupil distance d and the shape of the projected image defines an area 95 that substantially circumscribes the focus detection pupils 93 and 94.

The photoelectric conversion unit 11 outputs a signal corresponding to the intensity of an image formed on the micro-lens 10 with the photographic light flux 71 having passed through the area 95 and having advanced toward the micro-lens 10.

Figure 13:
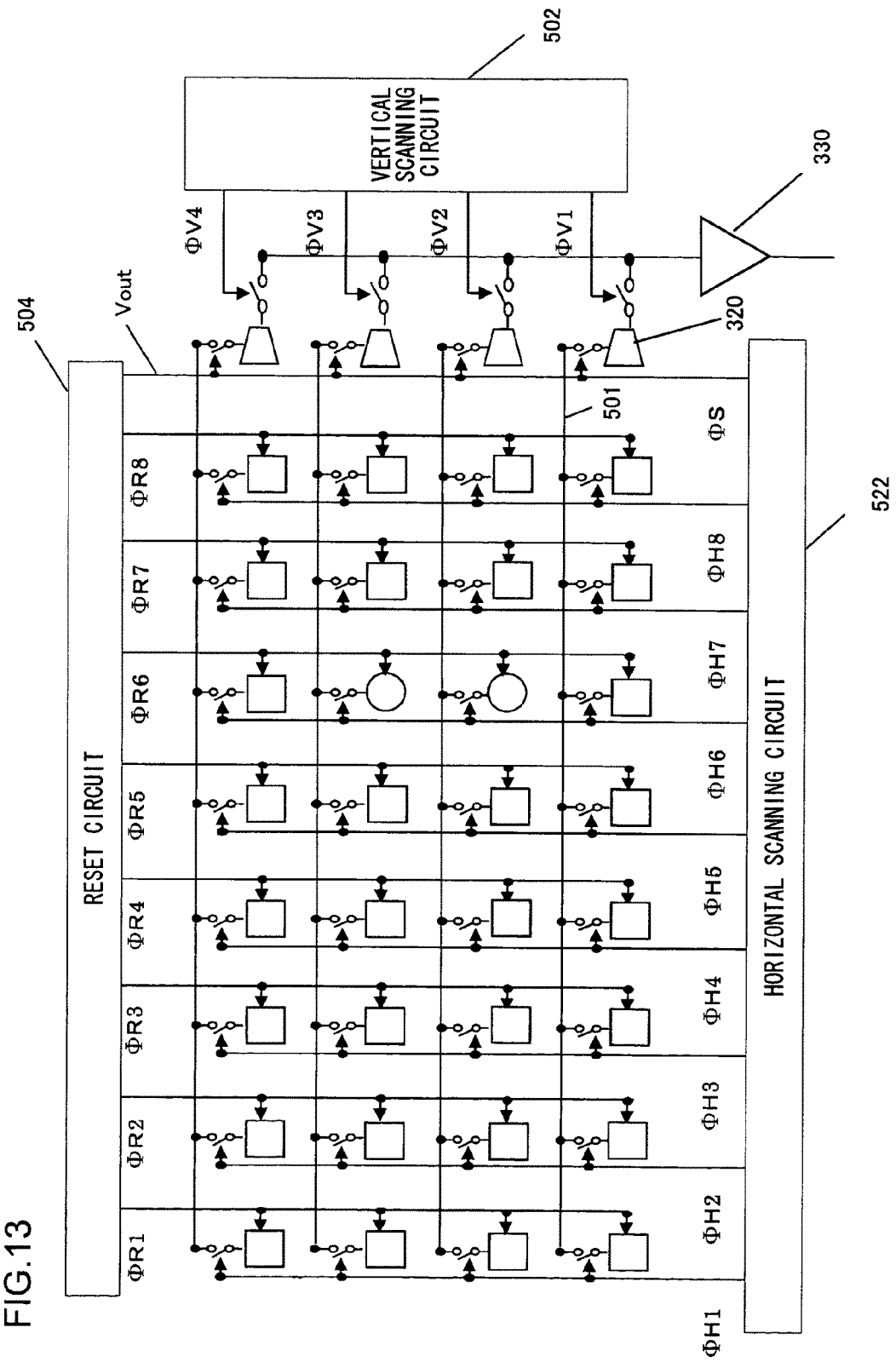
FIG. 13 shows the circuit structure of the image sensor in a simplified illustration.

A circuit structure that may be adopted in the image sensor 212 constituted with a CMOS image sensor is now described. FIG. 13 is a conceptual diagram illustrating the circuit structure of the image sensor 212.

While electrical charges are stored with uniform timing at pixels on a given scanning line, electrical charges are stored at pixels on different scanning lines with varying timing at a CMOS image sensor, as known in the related art. If the electrical charges are stored with varying timing at the focus detection pixels in the focus detection pixel column described above, the simultaneity (identicality) of the images in each image pair generated via the focus detection pixel column through the focus detection executed for a moving subject will be disrupted. This, in turn, will cause a detection error in the image shift detection to be detailed later. Accordingly, in order to match the timing with which the electrical charges are stored at the focus detection pixels in the focus detection pixel column, scanning lines at the image sensor 212 constituted with the CMOS image sensor are set in the embodiment along the direction in which the focus detection areas 101 through 103 extend in FIG. 2 (along the shorter side of the rectangular image plane). However, the present invention is not limited to this example.

FIG. 13 shows the circuit structure of the image sensor 212 in a simplified layout that includes eight pixels (across) x four pixels (down). Focus detection pixels 313 and 314 (○: two pixels each indicated by a circle) are disposed at the second pixel position and the third pixel position in the sixth column extending along the vertical direction, with the other pixel positions taken up by image-capturing pixels 310 (□: pixels each indicated by a square). The following is a detailed description of the operation executed in the circuit shown in FIG. 13.

Line memories 320 in FIG. 13 are buffers which temporarily hold the pixel signals from the pixels in a single by sampling and holding the pixel signals. They simultaneously sample and hold the pixel signals corresponding to a given column having been output to a signal line Vout, based upon a control signal ØS issued by a horizontal scanning circuit 522. It is to be noted that pixel signals held in the line memories 320 are reset synchronously with the leading edge of control signals ØH1~ØH8.

The outputs of the pixel signals from the image-capturing pixels 310 and the focus detection pixels 313 and 314 are controlled independently for each column with the control signals (ØH1~ØH8) issued by the horizontal scanning circuit. The pixel signal at a pixel belonging to a specific column selected by a control signal (ØH1~ØH8) is output to a corresponding signal line 501. The pixel signals held in the line memories 320 are sequentially transferred to an output circuit 330 in response to control signals (ØV1~ØV4) issued by a vertical scanning circuit 502 and the transferred signals are amplified at the output circuit 330 at a specific amplification factor set thereat before being output to the outside. After the signals from the image-capturing pixels 310 are sampled and held, the image-capturing pixels 310 are reset in response to control signals (ØR1~ØR8) issued by a reset circuit 504 and starts electrical charge storage in order to generate the next pixel signals.

Figure 14:
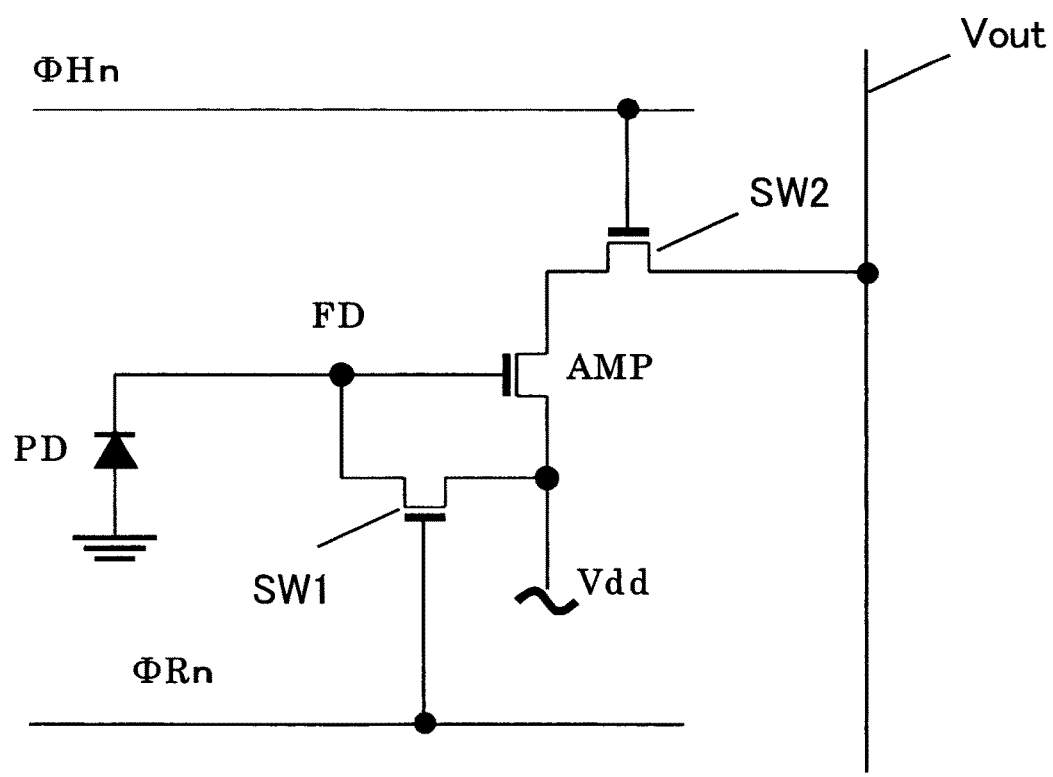
FIG. 14 shows the basic circuit structure pertaining to a photoelectric conversion unit in each image-capturing pixel and each focus detection pixel.

The photoelectric conversion units disposed at the image-capturing pixels 310 and the focus detection pixels 313 and 314 each adopt the basic circuit structure shown in FIG. 14. The photoelectric conversion unit is constituted with a photo diode (PD). The electrical charge stored at the PD is accumulated at a floating diffusion layer (floating diffusion: FD). The FD is connected to the gate of an amplifier MOS transistor (AMP) which generates a signal corresponding to the amount of electrical charge accumulated at the FD.

The FD is connected to a source voltage Vdd via a reset MOS transistor SW1 and as the reset MOS transistor SW1 is turned on in response to a control signal ØRn, the electrical charge having accumulated at the FD and the PD is cleared, thereby allowing the FD and the PD to enter a reset state. The output of the AMP is connected to a vertical output line Vout via a row selector MOS transistor SW2 and as the row selector MOS transistor SW2 is turned on in response to a control signal ØSn, the output of the AMP is provided to the vertical output line Vout.

Figure 15:
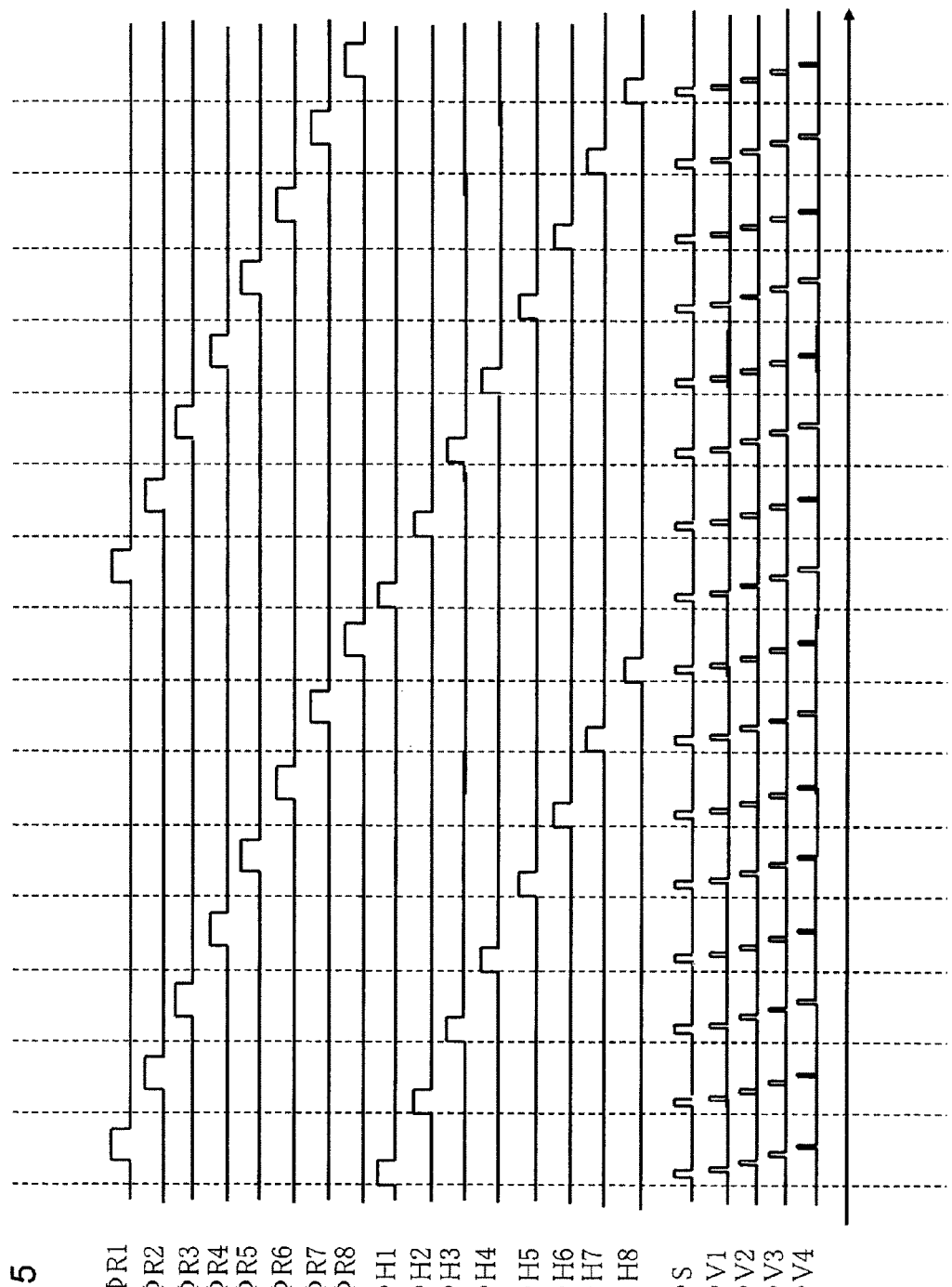
FIG. 15 presents a timing chart of the operation executed at the image sensor.

FIG. 15 presents a timing chart of the operation executed at the image sensor 212 shown in FIG. 13. The image-capturing pixels 310 in the first column are selected by the control signal ØH1 issued from the horizontal scanning circuit 522, and the pixel signals at the selected image-capturing pixels 310 are output to the signal lines 501. The pixel signals originating in the first column output to the signal lines 501 in response to the control signal ØS generated synchronously with the control signal ØH1 are temporarily held in the line memories 320. The pixel signals from the image-capturing pixels 310 in the first column held in the line memories 320 are transferred to the output circuit 330 in response to the control signals ØV1~ØV4 sequentially issued from the vertical scanning circuit 502. The transferred signals are amplified at the output circuit 330 at the amplification factor set thereat before they are output to the outside.

As the transfer of the pixel signals from the image-capturing pixels 310 in the first column to the line memories 320 ends, the image-capturing pixels 310 in the first column are reset in response to the control signal ØR1 provided from the reset circuit 504 and the next charge storage at the image-capturing pixels in the first column starts as the control signal ØR1 starts to fall. As the output of the pixel signals from the image-capturing pixels 310 in the first column via the output circuit 330 ends, the image-capturing pixels 310 in the second column are selected by the control signal ØH2 issued by the horizontal scanning circuit 522 and the pixel signals at the selected image-capturing pixels 310 are output to the signal lines 501. Subsequently, the pixel signals from the image-capturing pixels 310 in the second column are held, the focus detection pixels 313 and 314 are reset, the pixel signals are output and the next charge storage starts in a manner similar to that described above.

The pixel signals at the image-capturing pixels 310 and the focus detection pixels 313 and 314 in the third through eighth columns are held, the image-capturing pixels 310 and the focus detection pixels 313 and 314 are reset, the pixel signals from the image-capturing pixels 310 and the focus detection pixels 313 and 314 are output and the subsequent charge storage starts in a similar manner. Once the output of the pixel signals from all the pixels ends, the image-capturing pixels in the first column are selected again and the operation described above is cyclically repeated. In addition, by adjusting the pulse width of the control signals ØR1~ØR8, the length of time over which electrical charges are stored (exposure period) at the image-capturing pixels 310 and the focus detection pixels 313 and 314 can be adjusted.

Through the operation described above, the pixels are scanned at the image sensor 310 along the scanning direction running from the bottom of the image plane toward the top of the image plane over the rectangular image-capturing area 100, so as to sequentially output the signals from the pixels having been scanned to the outside. In addition, the scanning line sequentially moves from the left side of the image plane toward the right side of the image plane and thus, the signals from all the pixels present in the image plane are output to the outside. The scanning line extends along the direction matching the direction in which the shorter side of the rectangular image plane extends, which also matches the direction along which the focus detection pixels 313 and 314 are disposed side-by-side. As a result, the simultaneity with respect to the timing with which electrical charges are stored at the focus detection pixels 313 and 314 disposed in the same column can be sustained.

Figure 16:
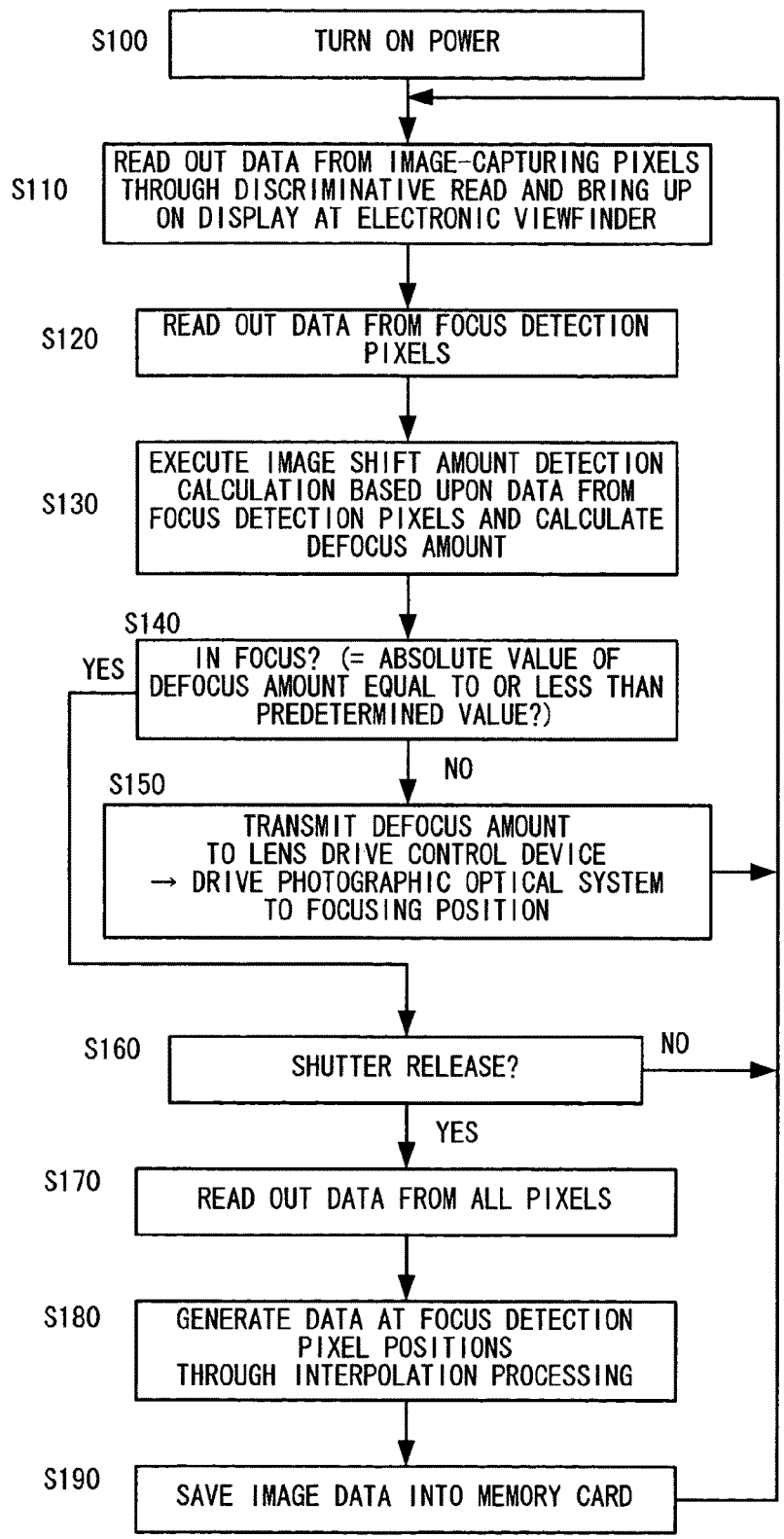
FIG. 16 presents a flowchart of the image-capturing operation executed in the digital still camera.

FIG. 16 presents a flowchart of the image-capturing operation executed in the digital still camera (image-capturing device) 201 achieved in the embodiment. As power to the digital still camera 201 is turned on in step S100, the body drive control device 214 starts the image-capturing operation executed in step S110 and subsequent steps. In step S110, data from the image-capturing pixels are read out through a discriminative read and the data thus read out are brought up on display at the electronic viewfinder. In the following step S120, a pair of sets of image data corresponding to a pair of images is read out from a focus detection pixel column. It is assumed that a specific focus detection area among the focus detection areas 101~103 is selected in advance by the photographer via a focus detection area selection member (not shown).

In step S130, an image shift amount is calculated through the image shift detection calculation processing (correlation calculation processing, phase detection processing) to be detailed later, which is executed based upon the pair of sets of image data having been read out and the image shift amount is converted to a defocus amount. In step S140, a decision is made as to whether or not the current state is close to the focusing position, i.e., whether or not the absolute value of the defocus amount having been calculated is equal to or less than a predetermined value. If it is decided that the current state is not close to the focusing position, the operation proceeds to step S150 to transmit the defocus amount to the lens drive control device 206 and drive the focusing lens 210 in the interchangeable lens 202 to the focusing position. Subsequently, the operation returns to step S110 to repeatedly execute the operation described above.

It is to be noted that the operation also branches to this step if focus detection cannot be executed. In this case, a scan-drive instruction is transmitted to the lens drive control device 206 so as to scan-drive the focusing lens 210 in the interchangeable lens 202 over the range between infinity and maximum close-up. The operation then returns to step S110 to repeatedly execute the operation described above.

If, on the other hand, it is decided in step S140 that the current state is close to the focusing position, the operation proceeds to step S160 to make a decision as to whether or not a shutter release has occurred in response to an operation at a shutter release button (not shown). If it is decided that a shutter release has not occurred, the operation returns to step S110 to repeatedly execute the operation described above. If it is decided that a shutter release has occurred, the operation proceeds to step S170 to transmit an aperture adjustment instruction to the lens drive control device 206 so as to adjust the aperture value at the interchangeable lens 202 to a control F number (an F number selected automatically or selected by the photographer). Once the aperture control ends, the image sensor 212 is engaged in image-capturing operation and image data are read out from the image-capturing pixels 310 and all the focus detection pixels 313 and 314 in the image sensor 212.

In step S180, pixel data corresponding to the individual pixel positions in the focus detection pixel columns are generated through pixel interpolation executed based upon the data at image-capturing pixels 310 present around the focus detection pixels 313 and 314 and the data at the focus detection pixels 313 and 314. In the following step S190, generated image data constituted with the data from the image-capturing pixels 310 and the interpolated data are saved into the memory card 219 and then the operation returns to step S110 to execute the operation described above.

The image shift detection calculation processing (correlation calculation processing, phase detection processing) executed in step S130 in FIG. 16 is now described in detail.

Since the focus detection pupils 93 and 94 may be vignetted by the aperture opening at the lens, a perfect balance may not be achieved with regard to the amounts of light in the pair of images detected via a given pair of focus detection pixels 313 and 314. Accordingly, a specific type of correlation calculation that allows a desired level of image shift detection accuracy to be maintained in spite of an imbalance in the amounts of light is executed. The correlation calculation is executed on a pair of data strings ($A1_1, \ldots A1_m$, $A2_1, \ldots, A2_m$: M represents the number of sets of data) read out from the focus detection pixel columns as expressed in correlation calculation expression (1) disclosed in Japanese Laid Open Patent Publication No. 2007-333720 which is based upon a patent application submitted by the applicant of the present invention, so as to calculate a correlation quantity $C(k)$.

$$C(k) = \Sigma |A1_n \cdot A2_{n+1+k} - A2_{n+k} \cdot A1_{n+1}| \quad (1)$$

In expression (1), the E operation is cumulatively executed with regard to n. The range assumed for n is limited to the range over which the data $A1_n, A1_{n+1}, A2_{n+k}$ and $A2_{n+1+k}$ exist in correspondence to the image shift amount k. The shift amount k is an integer which represents a relative shift amount assuming a value taken in units matching the data interval with which the data in the data strings are sampled.

Figure 17A:
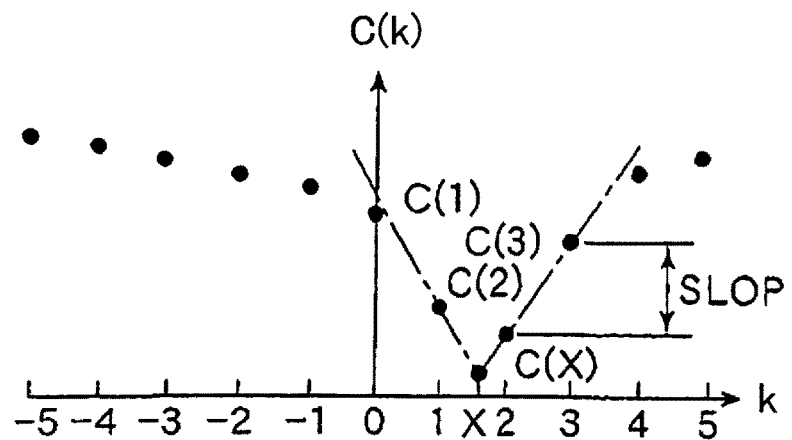
FIGS. 17A, 17B and 17C each indicate a relationship that may be observed with regard to the correlation quantity C(k) relative to the shift amount k representing the extent of shift between a pair of data strings.

The results of the arithmetic operation executed as expressed in (1) indicate that the correlation quantity $C(k)$ assumes the smallest value (the smaller the value, the higher the correlation level) at the shift amount at which the pair of data strings achieve a high level of correlation (when k=2 in FIG. 17A). The shift amount x, which gives the minimal value $C(x)$ in the continuous correlation quantity graph, is determined by adopting a three-point interpolation method expressed in (2)~(5) below.

$$x = k_j + D/SLOP \quad (2)$$

$$C(x) = C(k_j) - |D| \quad (3)$$

$$D = \{C(k_j-1) - C(k_j+1)\}/2 \quad (4)$$

$$SLOP = MAX\{C(k_j+1) - C(k_j), C(k_j-1) - C(k_j)\} \quad (5)$$

Figure 17B:
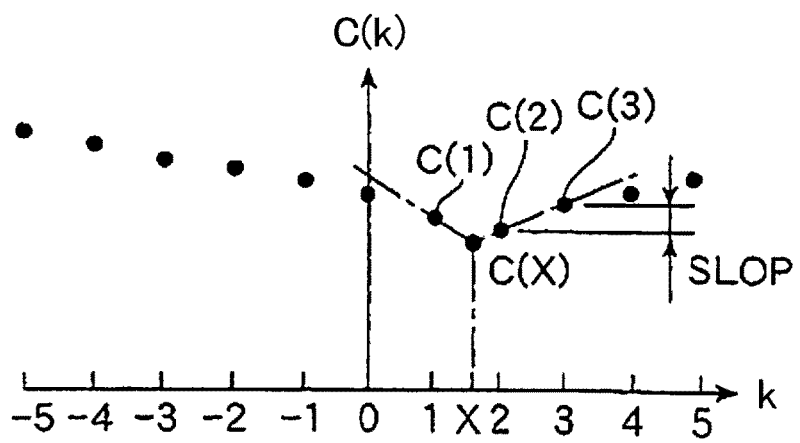

The judgment as to whether or not the shift amount x calculated as expressed in (2) is reliable is made as follows. As shown in FIG. 17B, the interpolated minimal value $C(x)$ of the correlation quantity increases when the level of correlation between the pair of data strings is low. Accordingly, if $C(x)$ is equal to or greater than a predetermined threshold value, the shift amount x having been calculated is judged to be less reliable and the calculated shift amount x is canceled. Alternatively, $C(x)$ may be standardized with regard to the data contrast, and in such a case, if the value obtained by dividing $C(x)$ by SLOP indicating a value in proportion to the contrast is equal to or greater than a predetermined value, the calculated shift amount x should be judged to be not reliable and accordingly, the calculated shift amount x should be canceled.

Figure 17C:
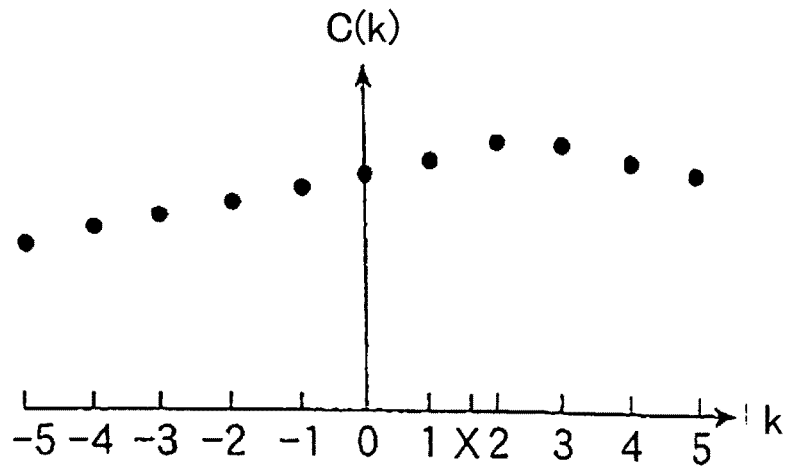

As a further alternative, if SLOP taking on the value in proportion to the contrast is equal to or less than a predetermined value, the subject should be judged to be a low-contrast subject. Accordingly, the reliability of the calculated shift amount should be judged to be low and the calculated shift amount x should be canceled in such a case. If the level of correlation between the pair of data strings is low and the correlation quantity $C(k)$ does not dip at all over the offset range $k_{min}$ to $k_{max}$, as shown in FIG. 17C, the minimal value $C(x)$ cannot be determined. In this case, it is decided that focus detection cannot be executed. If the calculated shift amount x is determined to be reliable, it is converted to an image shift amount shft as expressed in (6) below.

$$shft = PY \cdot x \quad (6)$$

PY in expression (6) represents a value (detection pitch) twice the pixel pitch with which the focus detection pixels 313 and 314 are disposed. The image shift amount calculated as expressed in (6) is then multiplied by a predetermined conversion coefficient Kd so as to convert it to a defocus amount def.

$$def = Kd \cdot shft \quad (7)$$

In the embodiment described above, the extent to which the level of focus detection performance is lowered due to diffraction is minimized by forming the micro-lenses at the focus detection pixels 313 and 314 in a rectangular shape. By disposing ND filters to function as adjustment means at the focus detection pixels 313 and 314, it is ensured that the output level at the focus detection pixels 313 and 314 never exceeds the output level at the image-capturing pixels 310 even when the openings at the micro-lenses range over a large area and that the output level at the focus detection pixels 313 and 314 corresponding to a given length of exposure period is always equal to or less than ¾ the output level at the image-capturing pixels 310 corresponding to the same length of exposure period. As a result, even when a pair of focus detection light fluxes are unevenly vignetted in an area corresponding to a peripheral area of the image plane range and a greater amount of light enters one of the focus detection pixels in the pair of focus detection pixels 313 and 314, the likelihood of the outputs from the focus detection pixels 313 and 314 becoming saturated can be reduced.

While the outputs from image-capturing pixels 310 may become saturated in an area of an image assuming a wide dynamic range, corresponding to a portion of the image plane, the outputs from the focus detection pixels 313 and 314 will remain unsaturated over such an area where the output level at the image-capturing pixels 310 slightly exceeds the saturation level, and thus, focus detection can be executed in this area.

According to the present invention, the signal output level at which signals from the focus detection pixels are output can be adjusted lower than the signal output level at the image-capturing pixels and thus, a situation in which the focus detection is disabled due to saturation of the outputs from the focus detection pixels can be avoided.

In addition, since the likelihood of the outputs from the focus detection pixels 313 and 314, which are also used in the pixel interpolation processing, becoming saturated due to vignetting of the focus detection light fluxes is reduced, the pixel interpolation performance level is improved to result in better image quality.

—Variations—

In the embodiment of the present invention described above, ND filters are disposed at the focus detection pixels 313 and 314 in order to adjust the signal output level at the focus detection pixels 313 and 314 so that signals are output from the focus detection pixels 313 and 314 under given exposure conditions at an output level never exceeding the signal output level with which signals are output from the image-capturing pixels 310 under the same exposure conditions. However, the signal level of the focus detection signals output from the focus detection pixels 313 and 314 may be adjusted to a level lower than the signal level of the image signals output from the image-capturing pixels 310 by using a measure other than ND filters.

FIG. 18, which corresponds to FIG. 6B, shows the structure that may be adopted in the focus detection pixels 313. A light shielding member 39 to be used for purposes of light amount adjustment is disposed in place of an ND filter. Although not shown, a similar structure will be adopted for the focus detection pixels 314. FIG. 19 shows focus detection pixels 313 and 314 structured as shown in FIG. 18 in a sectional view. A light shielding mask 30 is formed above and in close proximity to the photoelectric conversion units 13 and 14 engaged in focus detection and the photoelectric conversion units 13 and 14 respectively receive light having passed through openings 30b and 30c at the light shielding mask 30. A leveling layer 31 is formed above the light shielding mask 30 and above the leveling layer 31, light shielding members 39 are formed above the leveling layer 31. A leveling layer 32 is formed above the light shielding members 39 and micro-lenses 10 are formed above the leveling layer 32. The shapes of the openings 30b and 30c are projected forward via the micro-lenses 10. The photoelectric conversion units 13 and 14 are formed on a semiconductor substrate 29.

The light shielding members 39, each disposed in close proximity to a micro-lens 10, blocks the light flux passing through an area near the optical axis of the micro-lens 10. The amount of light can thus be adjusted and also, since the extent of blurring that occurs as the projected images of the opening 30b and 30c become diffracted is reduced due to the apodization effect, thereby improving the pupil-splitting accuracy performance.

The light shielding members 39 may be disposed at positions other than those shown in FIG. 18, the centers of the focus detection pixels 313 and 314. In addition, the light shielding members 39 may each conclude around opening 39a formed at the center thereof, as shown in FIG. 20, so as to reduce the amount of light entering the corresponding photoelectric conversion unit 13 or 14 by blocking the outer edge of the light flux having been transmitted through the micro-lens 10, along the full circumference.

The light having entered the outer edge area of the micro-lens 10 included in the light flux having entered the micro-lens 10 tends to readily become stray light due to a relatively significant aberration occurring at the outer edge area of the micro-lens 10.

Accordingly, by blocking the outer edge portion of the light flux transmitted through the micro-lens 10 with the light shielding member 39, occurrence of stray light can be prevented in addition to achieving the advantage of reducing the amount of light entering the corresponding photoelectric conversion unit 13 or 14.

Figure 20:
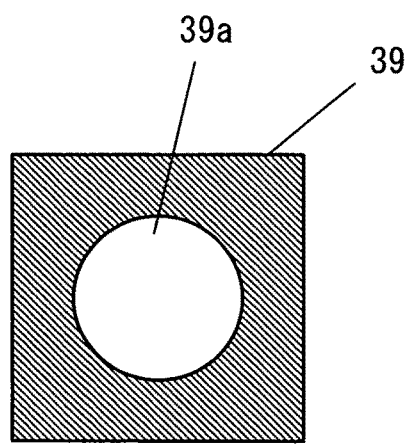
FIG. 20 shows a light shielding member in a front view.

The opening 39a at the light shielding member 39 may assume a shape other than a round shape such as that shown in FIG. 20. For instance, it may be formed in a polygonal shape such as a hexagon or an octagon. The opening 39a at the light shielding member 39 may assume an open-ended shape such as that shown in FIG. 21 instead of the closed-off shape shown in FIG. 20.

Figure 21:
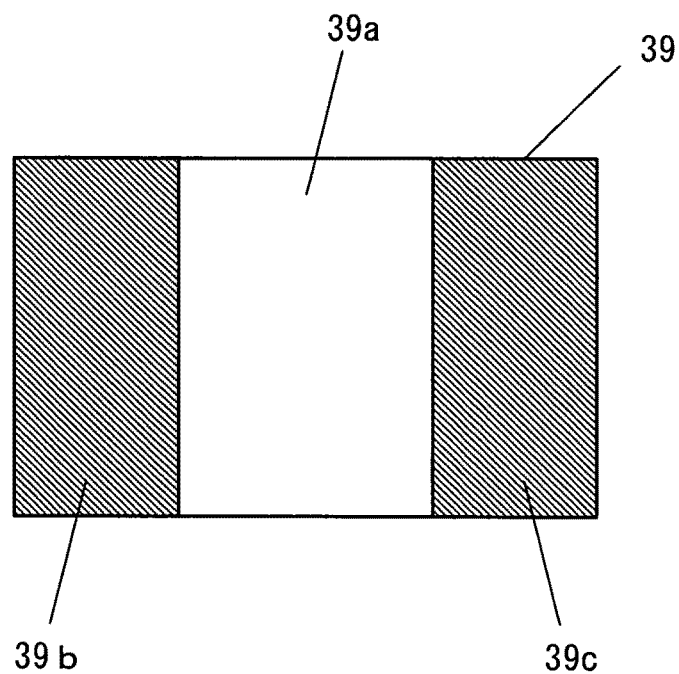
FIG. 21 shows another shielding member in a front view.

The light shielding member 39 in FIG. 21 includes a pair of light shielding member portions 39b and 39c set on the two sides of the opening 39a and the pair of light shielding member portions 39b and 39c are set along the direction in which the focus detection pixels 313 and 314 are set side-by-side.

As an alternative, a half-mirror (beam splitter) member may be disposed in each of the optical paths extending from the micro-lenses 10 at the focus detection pixels 313 and 314 to the photoelectric conversion units 13 and 14, so as to adjust the signal output level at which signals are output from the focus detection pixels 313 and 314 under given exposure conditions to a level lower than the signal output level at which signals are output from the image-capturing pixels 310 under the same exposure conditions by reflecting part of the light fluxes to enter the focus detection pixels 313 and 314 to the outside of the focus detection pixels 313 and 314. In more specific terms, a thin film achieving a half mirror function, constituted with, for instance, a multilayer film, may be formed at the surfaces of the micro-lenses 10 of the focus detection pixels 313 and 314 or the surfaces of the photoelectric conversion units 13 and 14. The presence of such a thin film makes it possible to adjust the signal level of the focus detection signals output from the focus detection pixels 313 and 314 to a level lower than the signal level of the image signals output from the image-capturing pixels 310.

While a description has been given in reference to FIG. 10 by assuming that the light reducing filters 34 are constituted with ND filters, the light reducing filters 34 do not need to be ND filters. This point is now explained.

The color filters 8 in FIG. 9 may be photonic-crystal color filters assuming a multilayer structure achieved by layering a highly refractive inorganic material and a less refractive inorganic material multiple times. The highly refractive inorganic material may be $TiO_2$, whereas the less refractive inorganic material may be $SiO_2$. Color filters manifesting red, green and blue spectral characteristics by adjusting the film thicknesses of the layers constituted of the highly refractive material $TiO_2$ and the less refractive material $SiO_2$ in the multilayer photonic-crystal color filter. It is to be noted that inorganic materials other than $TiO_2$ and $SiO_2$ may be used as the highly refractive inorganic material and the less refractive inorganic material. For instance, SiN may be used in place of $TiO_2$.

The light reducing filters 34 are formed above the leveling layer 31 FIG. 10. The light reducing filters 34 are formed at the same layer at which the color filters 38 of the image-capturing pixels 310 are formed. Namely, the light reducing filters are formed so as to assume the same height as the color filters 38. The light reducing filters 34, too, may be photonic-crystal filters assuming a multilayer structure constituted of inorganic materials identical to those constituting the color filters 38. The light reducing filters 34 in such a case will thus assume a multilayer structure constituted of the highly refractive inorganic material $TiO_2$ and the less refractive inorganic material $SiO_2$. The multilayered strata bodies 34 should assume spectral characteristics that allow the light in the entire visible range to be transmitted. In other words, the multilayered strata bodies should assume spectral characteristics achieved by integrating the spectral characteristics of the color filters at the red pixels, the spectral characteristics of the color filters at the green pixels and the spectral characteristics of the color filters at the blue pixels.

The multilayered strata bodies 34 function as follows. The amount of light entering the photoelectric conversion unit 11 of each image-capturing pixel 310 equipped with a color filter 38 is reduced by the color filter 38. Since no color filters are present at the focus detection pixels 313 and 314, the output signal level at the focus detection pixels 313 and 314 may exceed the output signal level at the image-capturing pixels 310, and thus, the output signals from the focus detection pixels may become saturated ahead of the output signals from the image-capturing pixels 310. In order to prevent such saturation of the output signal level at the focus detection pixels 313 and 314, the amounts of light entering the photoelectric conversion units 13 and 14 at the focus detection pixels 313 and 314 are reduced via the multilayered strata bodies 34 to a level equal to or lower than the amount of light entering photoelectric conversion units 11 at image-capturing pixels 310.

The image-capturing pixels 310 and the focus detection pixels 313 and 314 may be manufactured through the following process. First, photoelectric conversion units 11, 13 and 14 are all formed at once on the semiconductor substrate 29. Next, the light shielding mask 30 is formed, and the leveling layer 31 is formed over the light shielding mask 30. Then, R, G and B color filters 38 are formed in sequence by layering the highly refractive inorganic material and the less refractive inorganic material multiple times. Next, the multilayered strata bodies 34 are formed by layering inorganic materials identical to those constituting the color filters 38. As an alternative, the multilayered strata bodies 34 may be formed before the formation of the color filters 38. The leveling layer 32 and the micro-lenses 10 are formed subsequently. Since the color filters 38 and the multilayered strata bodies 34 can be manufactured by using the same inorganic materials, the manufacturing process through which the image sensor 212 is manufactured, is simplified.

The signal level of the focus detection signals output from the focus detection pixels 313 and 314 may be adjusted to a level lower than the signal level of the image signals output from the image-capturing pixels 310 as described below in a structure that includes an antireflection thin film deposited between the light shielding mask 30 and the semiconductor substrate 29 having the photoelectric conversion unit 11, 13 and 14 formed thereupon.

Figure 22:
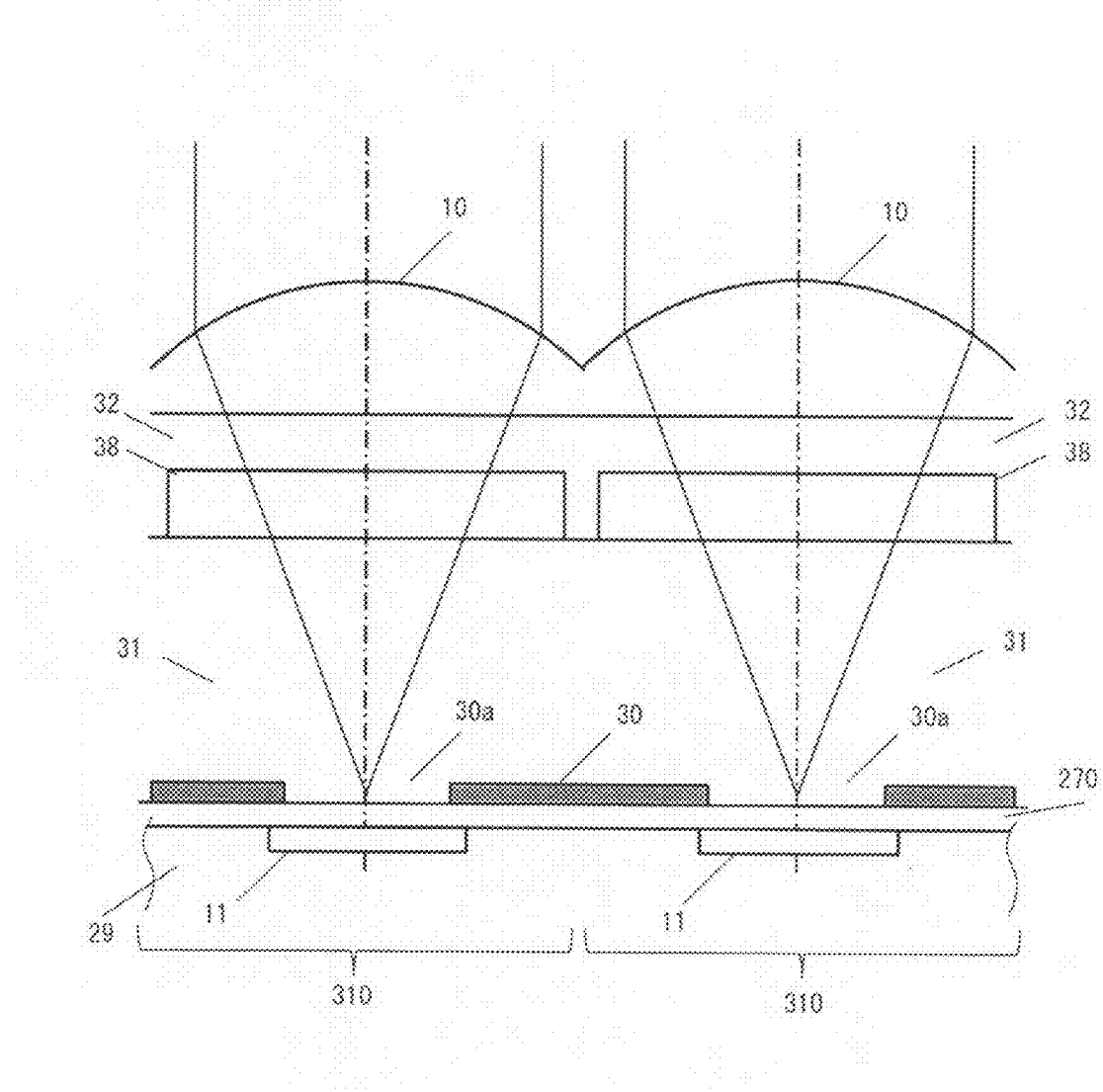
FIG. 22 shows image-capturing pixels in a sectional view.

FIG. 22 is a sectional view showing the structure of image-capturing pixels with an antireflection thin film formed therein. The image-capturing pixels 310 in FIG. 22 include an antireflection thin film 270 layered over the surface of the semiconductor substrate 29 at which the photoelectric conversion units 11 are formed, and this antireflection thin film 270 prevents the light to enter the photoelectric conversion units 11 from becoming reflected at the photoelectric conversion units. The antireflection film 270 is constituted with a multilayered body formed by layering a highly refractive inorganic material and a less refractive inorganic material. Other structural features of the image-capturing pixels 310 in FIG. 22 are identical to those of the image-capturing pixels in FIG. 9.

Figure 23:
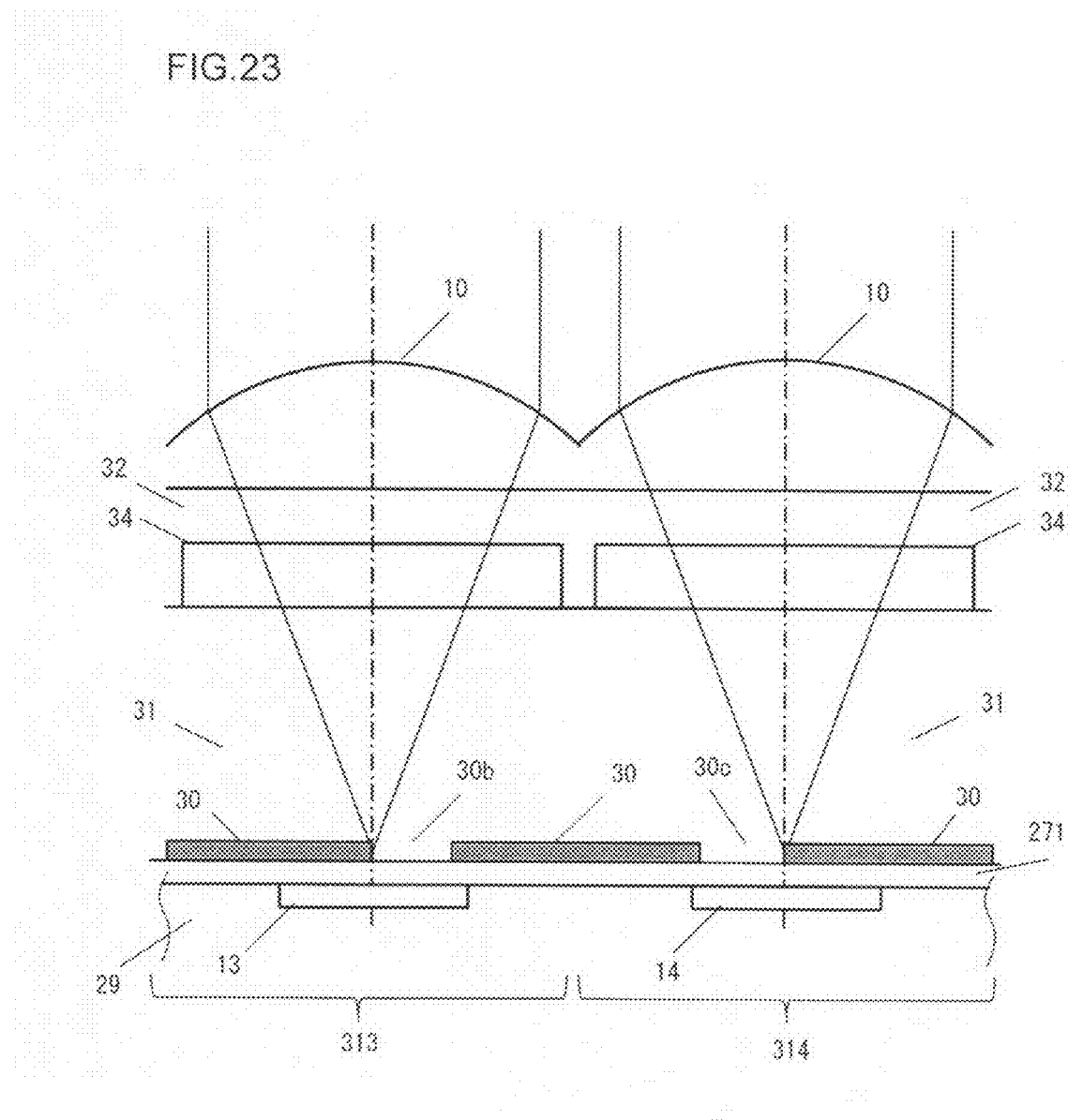
FIG. 23 shows focus detection pixels in a sectional view.

FIG. 23 is a sectional view showing the structure of focus detection pixels with an antireflection thin film formed therein. The focus detection pixels 313 and 314 include a thin film having an antireflection function and a light reducing function, i.e., an antireflection/light reducing filter 271, layered over the surface of the semiconductor substrate 29 having formed thereupon the photoelectric conversion units 13 and 14. The antireflection/light reducing filter 271, constituted with a multilayered body of inorganic materials identical to those constituting the antireflection films 270 shown in FIG. 22, has a function of preventing reflection and a function of reducing light. As do the light reducing filters 34 in FIG. 10, the antireflection/light reducing filter 271 reduces the amounts of light entering the photoelectric conversion units 13 and 14 and also prevents an occurrence of stray light by preventing reflection of the incoming light at the photoelectric conversion units 13 and 14. Thus, the light reducing filters 34 in FIG. 10 can be dispensed with by installing the antireflection/light reducing filter 271. However, it is not necessary that the light reducing filters 34 be eliminated and the focus detection pixels may each include both a light reducing filter 34 and the antireflection/light reducing filter 271. In such a case, the light reducing filters 34 and the antireflection/light reducing filter 271 work together so that the required extent of light reduction achieved for the light to enter the photoelectric conversion units 13 and 14 is contributed by the light reducing filters 34 and the antireflection/light reducing filter 271.

The antireflection/light reducing filter 271 disposed at the focus detection pixels in place of the antireflection film 270 is formed at the same layer as that where the antireflection film 270 is formed by using materials identical to those constituting the antireflection film 270. Accordingly, when manufacturing the image-capturing pixels 310 and the focus detection pixels 313 and 314, the antireflection/light reducing filter 271 can be formed either before or after the formation of the antireflection film 270, i.e., either immediately before or immediately after the antireflection film 270 is formed.

Figure 24:
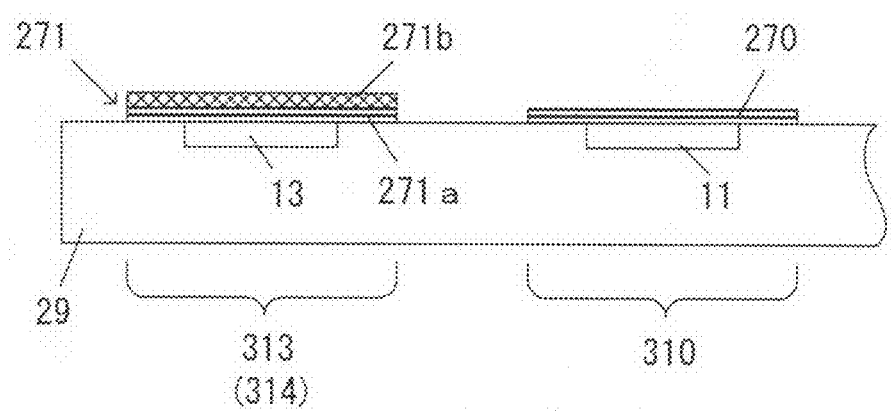
FIG. 24 shows in a sectional view a specific structure that may be adopted the antireflection/light reducing filter.

FIG. 24 presents a specific example of a structure that may be adopted in the antireflection/light reducing filter 271 shown in FIG. 23. As shown in FIG. 24, the image-capturing pixels 310 formed at the semiconductor substrate 29 each includes a photoelectric conversion unit 11 with an antireflection film 270 layered over the photoelectric conversion unit 11. As explained earlier, the antireflection film 270 is constituted as a multilayered body by using a highly refractive inorganic material and a less refractive inorganic material.

The focus detection pixels 313 (314) formed at the semiconductor circuit board 29 each includes a photoelectric conversion unit 13 (14) with an antireflection film 271a layered over the photoelectric conversion unit 13 (14). The antireflection film 271a is a multilayered body constituted of materials identical to those constituting the antireflection film 270. Thus, the antireflection film 271a assumes a height equal to that of the antireflection film 270 and assumes a thickness equal to that of the antireflection film 270.

A light reducing thin film, i.e., a light reducing filter 271b, is layered over the antireflection film 271a at the photoelectric conversion unit 13. The light reducing filter 271b is a multilayer thin film constituted of inorganic materials identical to those constituting the antireflection films 271a and 270.

As described above, the antireflection/light reducing filter 271 shown in FIG. 24 includes the antireflection film 271a and the light reducing filter 271b layered over the antireflection film. Thus, the antireflection/light reducing filter 271 assumes a thickness greater than the thickness of the antireflection film 270 at the image-capturing pixel 310 by a degree corresponding to the thickness of the light reducing filter 271b. However, since the thicknesses of the antireflection film 271a and the light reducing filter 271b are both extremely small in comparison to the thicknesses of other components of the focus detection pixel 313 (314), the antireflection/light reducing filter 271 can be regarded to assume a height that substantially matches the height of the antireflection film 270 at the image-capturing pixel 310.

Figure 25:
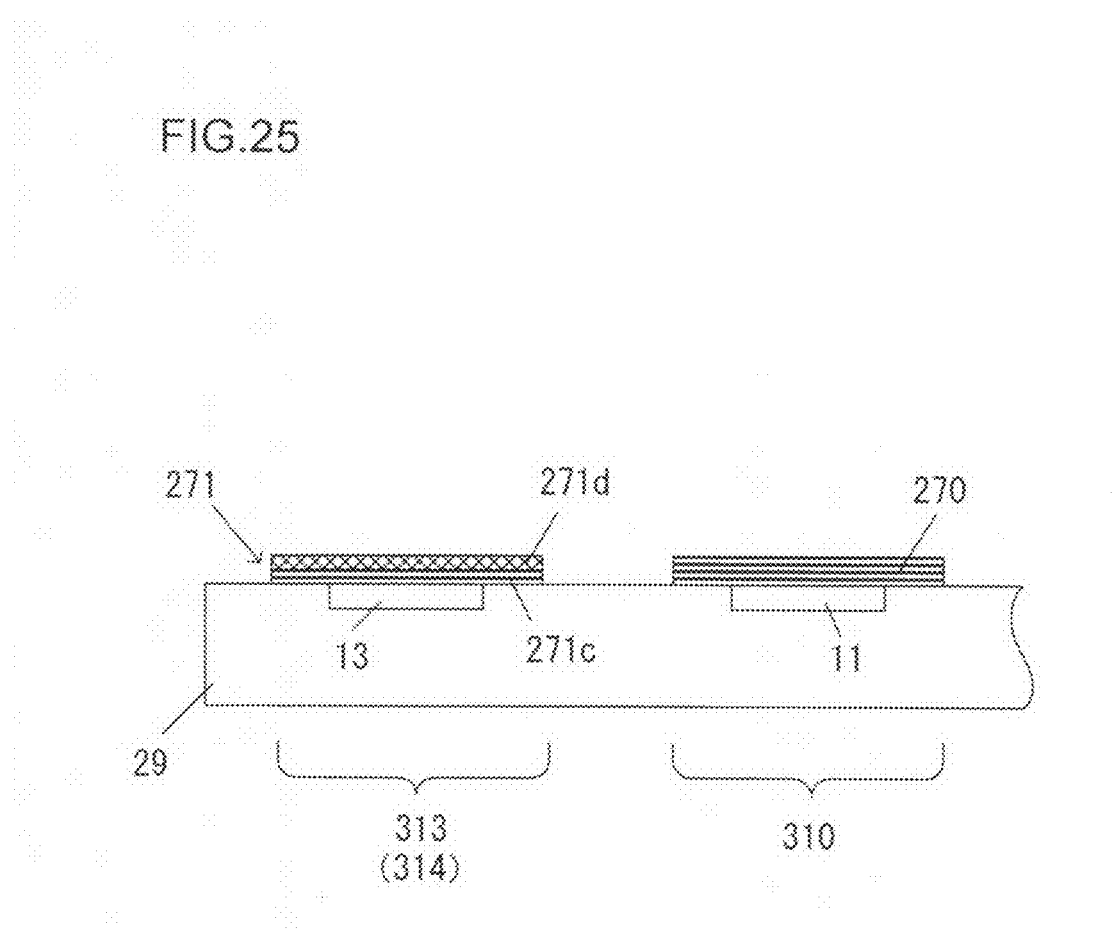
FIG. 25 shows in a sectional view another specific structure that may be adopted the antireflection/light reducing filter.

FIG. 25 presents another specific example of a structure that may be adopted in the antireflection/light reducing filter 271 shown in FIG. 23. The antireflection/light reducing filter 271 layered over the photoelectric conversion unit 13 (14) of the focus detection pixel 313 (314) includes an antireflection film 271c and a light reducing thin film, i.e., a light reducing filter 271d, layered in sequence over the photoelectric conversion unit 13 (14).

The antireflection film 271c and the light reducing filter 271d are each constituted as a multilayered body by using inorganic materials identical to those constituting the antireflection film 270 at the photoelectric conversion unit 11. The total thickness representing the sum of the thickness of the antireflection film 271c and the thickness of the light reducing filter 271d is equal to the thickness of the antireflection film 270 at the photoelectric conversion unit 11.

While an optical measure is utilized in each of the embodiments of the present invention described above to adjust the signal output level at the focus detection pixels 313 and 314 so that the output level at which signals are output from the focus detection pixels 313 and 314 under given exposure conditions, never exceeds the signal output level at which signals from the image-capturing pixels 310 are output under the same exposure conditions, such adjustment may be achieved through a measure other than this.

For instance, in conjunction with the pixel circuit structure shown in FIG. 14, the amplification factor at the amplifier MOS transistors (AMPs) at the focus detection pixels 313 and 314 may be set lower than the amplification factor at the amplifier MOS transistors (AMPs) of the image-capturing pixels 310 so as to ensure that the output level at which signals are output from the focus detection pixels 313 and 314 under given exposure conditions, never exceeds the signal output level at which signals from the image-capturing pixels 310 are output under the same exposure conditions. In other words, by using amplifier MOS transistors assuming different amplification factors at the focus detection pixels 313 and 314 and the image-capturing pixels 310, the signal level of the focus detection signals output from the focus detection pixels 313 and 314 can be lowered to a level lower than the signal level of the image signals output from the image-capturing pixels 310.

As an alternative, the quantum efficiency of the photoelectric conversion units 13 and 14 at the focus detection pixels 313 and 314 may be set lower than the quantum efficiency of the photoelectric conversion units at the image-capturing pixels 310, so as to ensure that the output level at which the signals are output from the focus detection pixels 313 and 314 under given exposure conditions never exceeds the signal output level at which signals from the image-capturing pixels 310 are output under the same exposure conditions. In more specific terms, when forming a photodiode (PN junction) to function as a photoelectric conversion unit on a semiconductor substrate, a thick depletion layer can be formed and thus the thickness of the P area can be reduced by controlling the depth of the photodiode. In this case, the incoming light will be mostly absorbed in the thick depletion layer and charge carriers will be generated as a result. Since the thickness of the P area is reduced, the charge carriers having been generated will not be allowed to recombine as they move. Consequently, charges can be extracted as an external current with a high level of quantum efficiency. Namely, by controlling the depth of the photodiode to function as the photoelectric conversion unit, being formed on the semiconductor substrate, the signal output level corresponding to the electrical signal generated upon receiving incoming light in a given amount can be varied, and this, the quantum efficiency can be controlled. By equipping the focus detection pixels 313 and 314 and the image-capturing pixels 310 with photoelectric conversion units having varying levels of quantum efficiency, the signal level of the focus detection signals output from the focus detection pixels 313 and 314 can be reduced to a level lower than the signal level of the image signals output from the image-capturing pixels 310.

As a further alternative, the length of time over which electrical charges are stored at the focus detection pixels 313 and 314 may be set less than the length of time over which electrical charges are stored at the image-capturing pixels 310, so as to ensure that the output level at which signals are output from the focus detection pixels 313 and 314 under given exposure conditions, never exceeds the signal output level at which signals from the image-capturing pixels 310 are output under the same exposure conditions. Through these measures, too, the signal level of the focus detection signals output from the focus detection pixels 313 and 314 can be adjusted to a level lower than the signal level of the image signals output from the image-capturing pixels 310.

Figure 26:
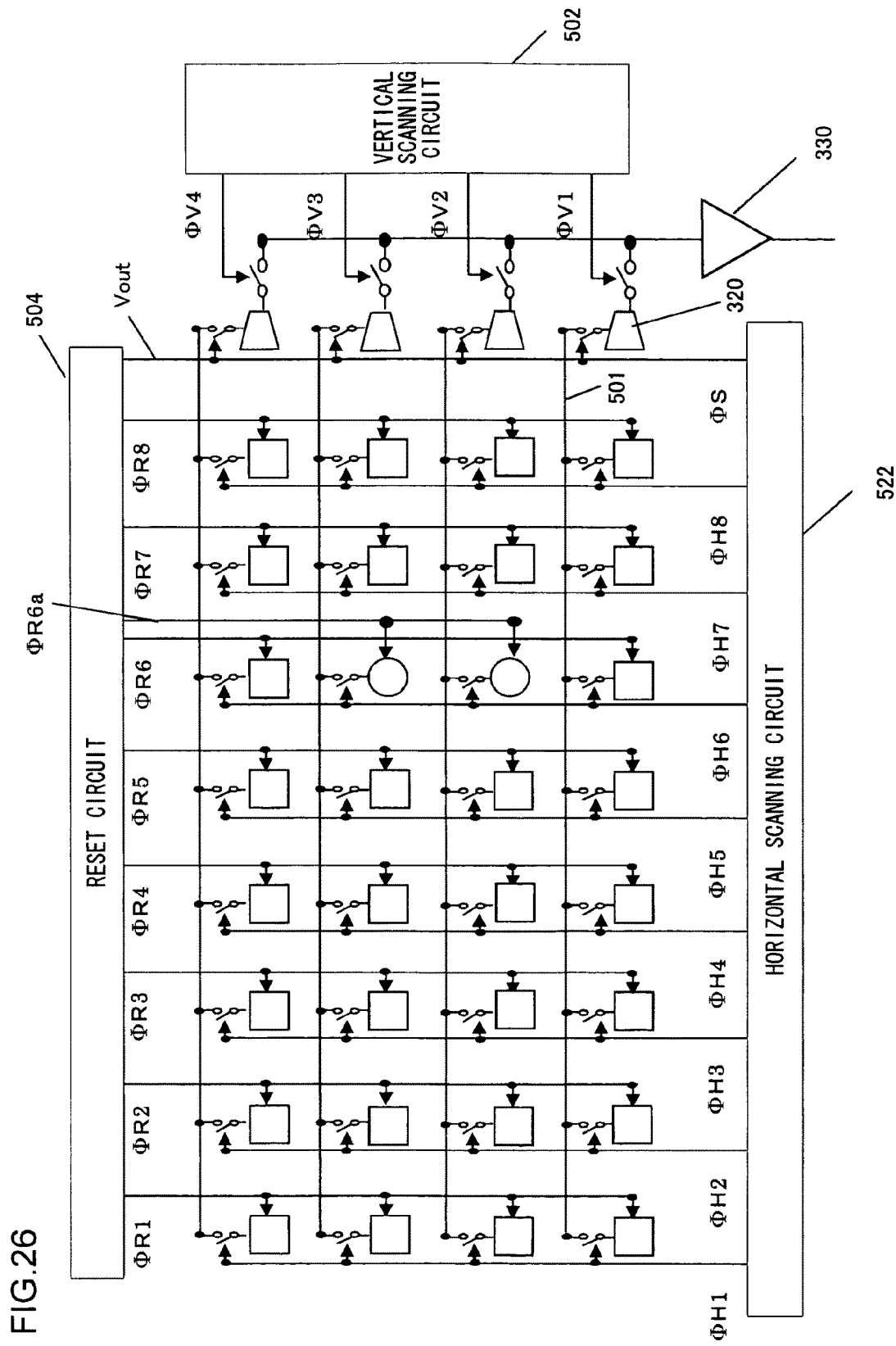
FIG. 26 shows the circuit structure of the image sensor in a simplified illustration.
Figure 27:
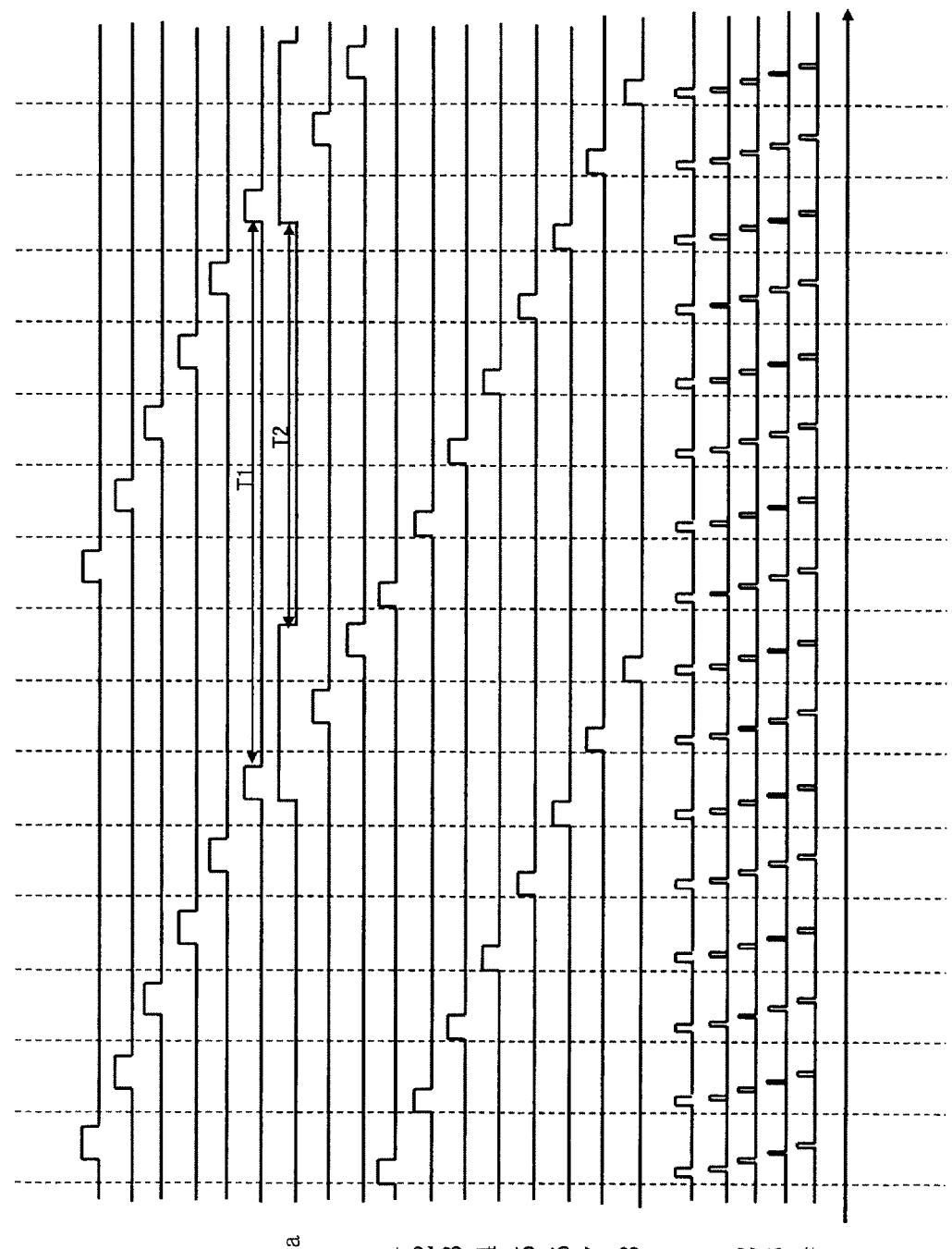
FIG. 27 presents a timing chart of the operation executed at the image sensor.

FIGS. 26 and 27 correspond to FIGS. 13 and 15 respectively, and show the circuit structure adopted in the image sensor 310 and present a timing chart of the operation executed at the image sensor 310. A repeated explanation of aspects of the image sensor 310 identical to those having already been described in reference to FIGS. 13 and 15 is not provided. The circuit structure in FIG. 26 differs from that in FIG. 13 in that the image-capturing pixels 310 and the focus detection pixels 313 and 314 in the sixth column are reset in response to different control signals ØR6 and ØR6a issued by the reset circuit 504 before they start charge storage to generate the next pixel signals.

In this structure, the focus detection pixels 313 and 314 in the sixth column are reset under control achieved with the control signal ØR6a, which rises simultaneously as the control signal ØR6 rises but starts to fall after the control signal ØR6 falls, as shown in FIG. 27. Thus, while electrical charges are stored at the image-capturing pixels 310 over a time period T1 elapsing while the control signals ØR1~ØR8 fall and then rise, electrical charges are stored at the focus detection pixels 313 and 314 over a time period T2 (shorter than the time period T1) elapsing while the control signal ØR6a falls and then rises. As a result, the signal output level at which signals are output from the focus detection pixels 313 and 314 under given exposure conditions is bound to be lower than the signal output level at which signals are output from the image-capturing pixels 310 under the same exposure conditions. The time period T2 is set via the reset circuit 522 so that its length is equal to or less than ¾ the length of the time period T1.

Figure 6C:
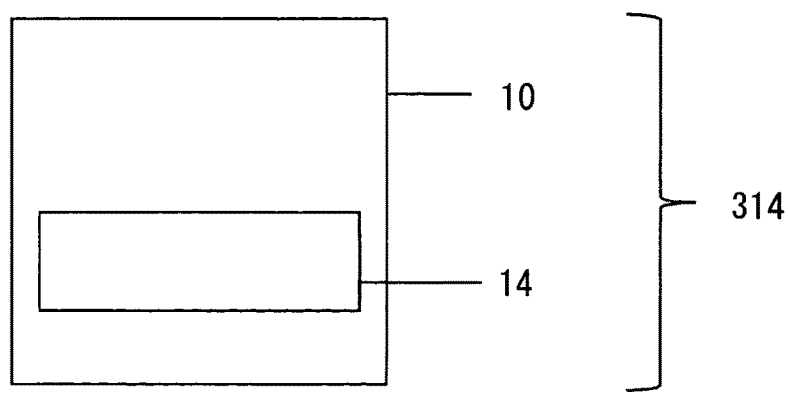
Figure 28:
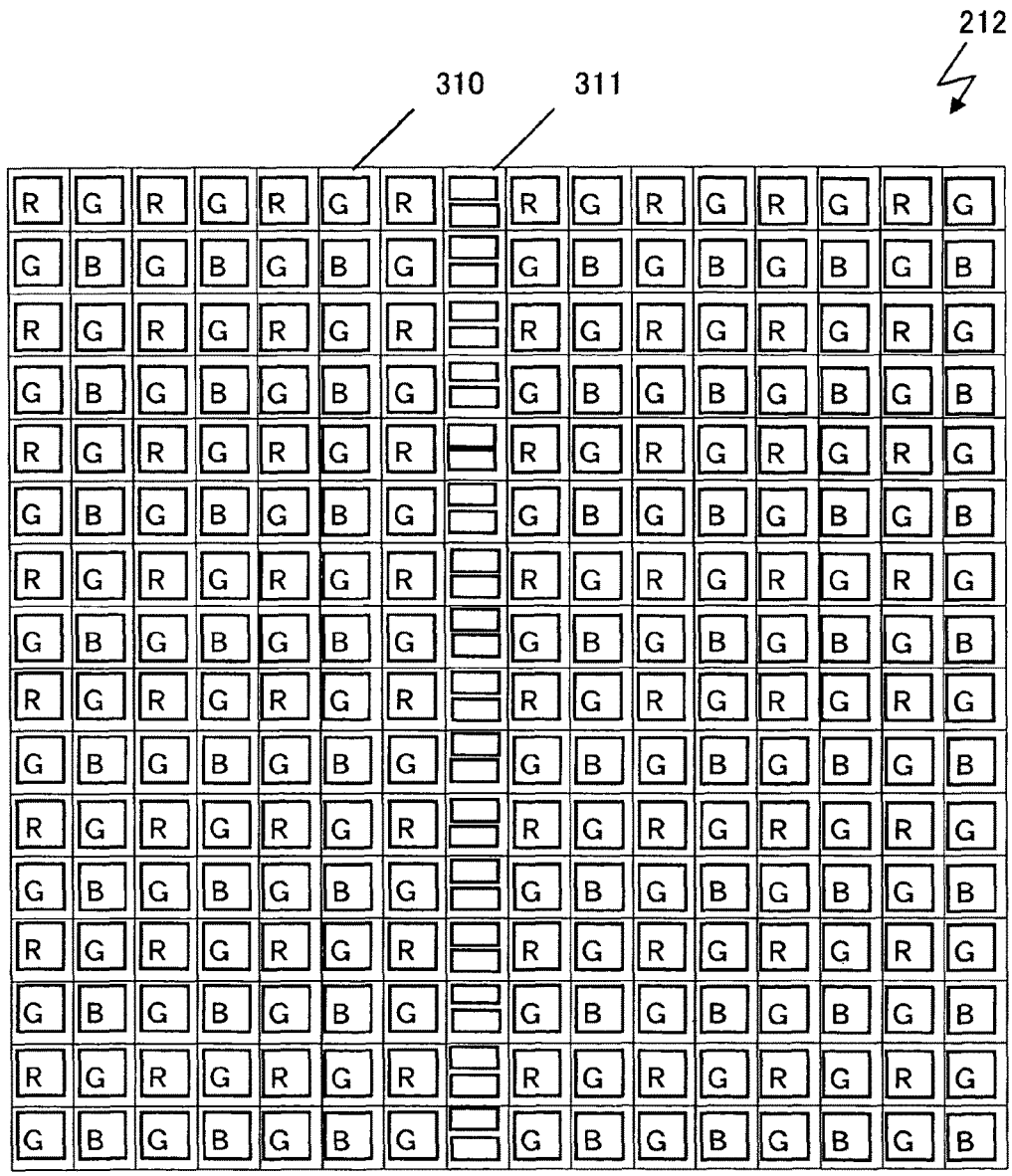
FIG. 28 shows in detail the structure of the image sensor in a partial enlargement of a front view.
Figure 29:
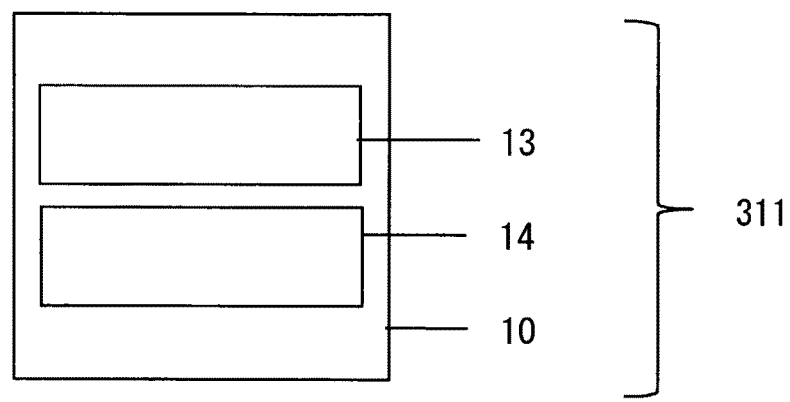
FIG. 29 shows focus detection pixels in front views.

While the image sensor 212 in FIG. 4 includes focus detection pixels 313 and 314, each equipped with a single photoelectric conversion unit, with a focus detection pixel 313 and an adjacent focus detection pixels 314 engaged in focus detection as a pair, the present invention may be adopted in conjunction with focus detection pixels each equipped with a pair of photoelectric conversion units. Focus detection pixels 311 at such an image sensor 212 shown in a partial enlargement in FIG. 28 each includes a pair of photoelectric conversion units. The focus detection pixel 311 shown in FIG. 29 fulfills a function achieved with the pair of focus detection pixels 313 and 314 shown in FIGS. 6B and 6C. As shown in FIG. 29, the focus detection pixel 311 is constituted with a micro-lens 10 and a pair of photoelectric conversion units 13 and 14. In order to assure a sufficient amount of light, no color filter is disposed at the focus detection pixel 311 and the spectral characteristics of the focus detection pixel are equivalent to the sum achieved by integrating the spectral sensitivity of the photodiodes engaged in photoelectric conversion and the spectral characteristics of an infrared cut-off filter (not shown). In other words, the focus detection pixels 311 achieve spectral characteristics equivalent to the sum of the spectral characteristics of the green pixels, the red pixels and the blue pixels shown in FIG. 8, which indicate sensitivity in a light wavelength range containing the light wavelength ranges corresponding to the sensitivity characteristics of the green pixels, the red pixels and the blue pixels.

FIG. 30 is a sectional view of focus detection pixels 311 structured as shown in FIG. 29. A light shielding mask 30 is formed above and in close proximity over the photoelectric conversion units 13 and 14 and the photoelectric conversion units 13 and 14 receive light having passed through openings 30d at the light shielding mask 30. The leveling layer 31 is formed above the light shielding mask 30 and above the leveling layer 31, ND filters 34 are formed. A leveling layer 32 is formed above the ND filters 34 and micro-lenses 10 are formed above the leveling layer 32. The shapes of the photoelectric conversion units 13 and 14, restricted by the openings 30*d* are projected forward via the micro-lenses 10, thereby forming a pair of focus detection pupils. The photoelectric conversion units 13 and 14 are formed on a semiconductor substrate 29.

While no optical element is disposed between the image sensor 212 and the optical system in the embodiments described above, an optical element may be inserted between them as needed. For instance, an infrared cut-off filter, an optical low pass filter, a half mirror or the like may be disposed. In conjunction with the image sensor structured as shown in FIG. 4, an optical low pass filter, with the characteristics thereof set so as to manifest a more intense high-frequency clipping effect along the direction in which the focus detection pixels are set side by side than along the direction perpendicular to the direction in which the focus detection pixels are disposed side-by-side may be installed so as to lessen the adverse effect of an image containing a high-frequency component present between the focus detection pixels, which is likely to compromise the focus detection accuracy.

The structure of the image-capturing pixels 310 having been described in reference to the sectional view in FIG. 10 is similar to the structures of the focus detection pixels 313 and 314 and the focus detection pixels 311 achieved in the embodiments described in reference to the sectional views in FIGS. 10 and 24, and by setting the thicknesses of the color filters 38 and the ND filters 34 substantially equal to each other, the distances between the photoelectric conversion units 13, 14 and 11 and the corresponding micro-lenses 10 can be equalized. In addition, since the focus detection pixels 313, 314 and 311 are equipped with ND filters 34 instead of the color filters 38 disposed at the image-capturing pixels 310, the image-capturing pixels 310 and the focus detection pixels 313, 314 and 311 can be manufactured through a substantially common manufacturing process. Accordingly, an integrated micro-lens array constituted with the focus detection pixels 313 and 314 or 311 and the image-capturing pixels 310 can be manufactured with ease. In addition, as explained earlier, the focus detection pixels 313 and 314 or 311 may be equipped with a measure other than the ND filters 34, via which the output level of the signals are output from the focus detection pixels 313 and 314 or 311 under given exposure conditions can be adjusted so as to never exceed the output level of the signals are output from the image-capturing pixels 310 under the same exposure conditions. In such a case, it is desirable to dispose colorless filters or the like at the focus detection pixels 313 and 314 or 311 in place of the ND filters 34 so as to equalize the distance from the photoelectric conversion units 13 and 14 to the corresponding micro-lenses 10, with the distance from the photoelectric conversion units 11 to the corresponding micro-lenses and ultimately allow the image-capturing pixels 310 and the focus detection pixels 313 and 314 or 311 to be manufactured through a substantially common process.

While the image-capturing pixels at the image sensor 212 in the embodiments described above include color filters disposed thereat in the Bayer array, the structure of the color filters or the pattern with which they are arrayed are not limited to those described in reference to the embodiments. For instance, the present invention may be adopted in conjunction with an image sensor assuming a filter array other than the Bayer array, e.g., a complementary color filter (green: G, yellow: Ye, magenta: Mg, cyan: Cy) array.

In addition, while the openings at the light shielding mask at the focus detection pixels achieved in the embodiments are rectangular, the shape of the openings at the light shielding mask is not limited to this example and the light shielding mask may have openings shaped in, for instance, a semicircular shape, an elliptical shape or a polygonal shape.

It is to be noted that the image-capturing device according to the present invention does not need to be a digital still camera or a film-type still camera with an interchangeable lens mounted at the camera body as described above. For instance, the present invention may be adopted in a digital still camera or a film-type still camera with an integrated lens or in a video camera. Furthermore, the present invention may be adopted in a compact camera module built into a portable telephone or the like, a visual recognition device used in a surveillance camera or in robotics applications, an on vehicle camera and the like.

What is claimed is:

1. An image sensor comprising:
a plurality of image-capturing pixels that, upon each receiving a partial light flux within a predetermined wavelength range, which is part of a photographic light flux used to form an optical image, output image signals corresponding to the optical image, each of the plurality of image-capturing pixels having an image-capturing photoelectric conversion unit that converts the partial light flux received thereat to an image signal among the image signals, the plurality of image-capturing pixels having first image-capturing pixels and second image-capturing pixels, each of the first image-capturing pixels having a first color filter through which a light flux in a first wavelength range set as the predetermined wavelength range is transmitted, each of the second image-capturing pixels having a second color filter through which a light flux in a second wavelength range set as the predetermined wavelength range different from the first wavelength range is transmitted;
a plurality of focus detection pixels that receive a pair of focus detection light fluxes in a wider wavelength range than the predetermined wavelength range and output a pair of focus detection signals, each of the plurality of focus detection pixels having a focus detection photoelectric conversion unit that converts a focus detection light flux received thereat in the focus detection light fluxes to a focus detection signal among the focus detection signals, the wider wavelength range of the focus detection light fluxes including the first wavelength range and the second wavelength range; and
a reduction unit that adjusts a signal level of the focus detection signals output from the plurality of focus detection pixels so as to ensure that the signal level of the focus detection signals, each output from one of the plurality of focus detection pixels under a given light receiving condition, is equal to or less than a signal level of the image signals each output from one of the plurality of image-capturing pixels under the given light receiving condition, the reduction unit including a light reducing unit that reduces an amount of light in the focus detection light flux received at the focus detection photoelectric conversion unit,
wherein:
each of the plurality of focus detection pixels includes a micro-lens;

the light reducing unit includes a light reducing filter disposed between the focus detection photoelectric conversion unit and the micro-lens; and the light reducing filter reduces an amount of light for a light flux in a substantially full visible light wavelength range.

2. An image sensor comprising:

a plurality of image-capturing pixels that, upon each receiving a partial light flux within a predetermined wavelength range, which is part of a photographic light flux used to form an optical image, output image signals corresponding to the optical image, each of the plurality of image-capturing pixels having an image-capturing photoelectric conversion unit that converts the partial light flux received thereat to an image signal among the image signals, the plurality of image-capturing pixels having first image-capturing pixels and second image-capturing pixels, each of the first image-capturing pixels having a first color filter through which a light flux in a first wavelength range set as the predetermined wavelength range is transmitted, each of the second image-capturing pixels having a second color filter through which a light flux in a second wavelength range set as the predetermined wavelength range different from the first wavelength range is transmitted;

a plurality of focus detection pixels that receive a pair of focus detection light fluxes in a wider wavelength range than the predetermined wavelength range and output a pair of focus detection signals, each of the plurality of focus detection pixels having a focus detection photoelectric conversion unit that converts a focus detection light flux received thereat in the focus detection light fluxes to a focus detection signal among the focus detection signals, the wider wavelength range of the focus detection light fluxes including the first wavelength range and the second wavelength range; and a reduction unit that adjusts a signal level of the focus detection signals output from the plurality of focus detection pixels so as to ensure that the signal level of the focus detection signals, each output from one of the plurality of focus detection pixels under a given light receiving condition, is equal to or less than a signal level of the image signals each output from one of the plurality of image-capturing pixels under the given light receiving condition, the reduction unit including a light reducing unit that reduces an amount of light in the focus detection light flux received at the focus detection photoelectric conversion unit, wherein:

each of the plurality of focus detection pixels includes a light shielding mask disposed substantially directly above the focus detection photoelectric conversion unit so as to block light other than the focus detection light flux and a micro-lens;

the light reducing unit includes a light shielding member disposed between the micro-lens and the light shielding mask; and the light shielding member blocks part of the focus detection light flux so as to ensure that the part of the focus detection light flux is not received at the focus detection photoelectric conversion unit.

3. An image sensor comprising:

a plurality of image-capturing pixels that, upon each receiving a partial light flux within a predetermined wavelength range, which is part of a photographic light flux used to form an optical image, output image signals corresponding to the optical image, each of the plurality of image-capturing pixels having an image-capturing photoelectric conversion unit that converts the partial light flux received thereat to an image signal among the image signals, the plurality of image-capturing pixels having first image-capturing pixels and second image-capturing pixels, each of the first image-capturing pixels having a first color filter through which a light flux in a first wavelength range set as the predetermined wavelength range is transmitted, each of the second image-capturing pixels having a second color filter through which a light flux in a second wavelength range set as the predetermined wavelength range different from the first wavelength range is transmitted;

a plurality of focus detection pixels that receive a pair of focus detection light fluxes in a wider wavelength range than the predetermined wavelength range and output a pair of focus detection signals, each of the plurality of focus detection pixels having a focus detection photoelectric conversion unit that converts a focus detection light flux received thereat in the focus detection light fluxes to a focus detection signal among the focus detection signals, the wider wavelength range of the focus detection light fluxes including the first wavelength range and the second wavelength range; and a reduction unit that adjusts a signal level of the focus detection signals output from the plurality of focus detection pixels so as to ensure that the signal level of the focus detection signals, each output from one of the plurality of focus detection pixels under a given light receiving condition, is equal to or less than a signal level of the image signals each output from one of the plurality of image-capturing pixels under the given light receiving condition, the reduction unit including a light reducing unit that reduces an amount of light in the focus detection light flux received at the focus detection photoelectric conversion unit, wherein:

the light reducing unit includes a beam splitter disposed at each of the plurality of focus detection pixels; and the beam splitter deflects part of the focus detection light flux toward outside of the plurality of focus detection pixels so as to ensure that part of the focus detection light flux is not received at the focus detection photoelectric conversion unit.

4. An image sensor comprising:

a plurality of image-capturing pixels that, upon each receiving a partial light flux within a predetermined wavelength range, which is part of a photographic light flux used to form an optical image, output image signals corresponding to the optical image, each of the plurality of image-capturing pixels having an image-capturing photoelectric conversion unit that converts the partial light flux received thereat to an image signal among the image signals, the plurality of image-capturing pixels having first image-capturing pixels and second image-capturing pixels, each of the first image-capturing pixels having a first color filter through which a light flux in a first wavelength range set as the predetermined wavelength range is transmitted, each of the second image-capturing pixels having a second color filter through which a light flux in a second wavelength range set as the predetermined wavelength range different from the first wavelength range is transmitted;

a plurality of focus detection pixels that receive a pair of focus detection light fluxes in a wider wavelength range than the predetermined wavelength range and output a pair of focus detection signals, each of the plurality of focus detection pixels having a focus detection photoelectric conversion unit that converts a focus detection light flux received thereat in the focus detection light fluxes to a focus detection signal among the focus detection signals, the wider wavelength range of the focus detection light fluxes including the first wavelength range and the second wavelength range; and a reduction unit that adjusts a signal level of the focus detection signals output from the plurality of focus detection pixels so as to ensure that the signal level of the focus detection signals, each output from one of the plurality of focus detection pixels under a given light receiving condition, is equal to or less than a signal level of the image signals each output from one of the plurality of image-capturing pixels under the given light receiving condition, the reduction unit including a light reducing unit that reduces an amount of light in the focus detection light flux received at the focus detection photoelectric conversion unit, wherein:

the light reducing unit includes a multilayered body disposed at each of the plurality of focus detection pixels; and the multilayered body blocks part of the focus detection light flux so as to ensure that the part of the focus detection light flux is not received at the focus detection photoelectric conversion unit.

5. An image sensor comprising:

a plurality of image-capturing pixels that, upon each receiving a partial light flux within a predetermined wavelength range, which is part of a photographic light flux used to form an optical image, output image signals corresponding to the optical image, each of the plurality of image-capturing pixels having an image-capturing photoelectric conversion unit that converts the partial light flux received thereat to an image signal among the image signals, the plurality of image-capturing pixels having first image-capturing pixels and second image-capturing pixels, each of the first image-capturing pixels having a first color filter through which a light flux in a first wavelength range set as the predetermined wavelength range is transmitted, each of the second image-capturing pixels having a second color filter through which a light flux in a second wavelength range set as the predetermined wavelength range different from the first wavelength range is transmitted;

a plurality of focus detection pixels that receive a pair of focus detection light fluxes in a wider wavelength range than the predetermined wavelength range and output a pair of focus detection signals, each of the plurality of focus detection pixels having a focus detection photoelectric conversion unit that converts a focus detection light flux received thereat in the focus detection light fluxes to a focus detection signal among the focus detection signals, the wider wavelength range of the focus detection light fluxes including the first wavelength range and the second wavelength range; and a reduction unit that adjusts a signal level of the focus detection signals output from the plurality of focus detection pixels so as to ensure that the signal level of the focus detection signals, each output from one of the plurality of focus detection pixels under a given light receiving condition, is equal to or less than a signal level of the image signals each output from one of the plurality of image-capturing pixels under the given light receiving condition, the reduction unit including a light reducing unit that reduces an amount of light in the focus detection light flux received at the focus detection photoelectric conversion unit, wherein:

the reduction unit includes a setting unit that selects a smaller setting for electrical charge storage time for photoelectric conversion of the focus detection light flux to the focus detection signal at the focus detection photoelectric conversion unit than a setting for electrical charge storage time for photoelectric conversion of the partial light flux to the image signal at the image-capturing photoelectric conversion unit.

6. An image sensor comprising:

a plurality of image-capturing pixels that, upon each receiving a partial light flux within a predetermined wavelength range, which is part of a photographic light flux used to form an optical image, output image signals corresponding to the optical image, each of the plurality of image-capturing pixels having an image-capturing photoelectric conversion unit that converts the partial light flux received thereat to an image signal among the image signals, the plurality of image-capturing pixels having first image-capturing pixels and second image-capturing pixels, each of the first image-capturing pixels having a first color filter through which a light flux in a first wavelength range set as the predetermined wavelength range is transmitted, each of the second image-capturing pixels having a second color filter through which a light flux in a second wavelength range set as the predetermined wavelength range different from the first wavelength range is transmitted;

a plurality of focus detection pixels that receive a pair of focus detection light fluxes in a wider wavelength range than the predetermined wavelength range and output a pair of focus detection signals, each of the plurality of focus detection pixels having a focus detection photoelectric conversion unit that converts a focus detection light flux received thereat in the focus detection light fluxes to a focus detection signal among the focus detection signals, the wider wavelength range of the focus detection light fluxes including the first wavelength range and the second wavelength range; and a reduction unit that adjusts a signal level of the focus detection signals output from the plurality of focus detection pixels so as to ensure that the signal level of the focus detection signals, each output from one of the plurality of focus detection pixels under a given light receiving condition, is equal to or less than a signal level of the image signals each output from one of the plurality of image-capturing pixels under the given light receiving condition, wherein:

first conversion characteristics, with which the focus detection photoelectric conversion unit converts the focus detection light flux having been received thereat to the focus detection signal, are different from second conversion characteristics with which the image-capturing photoelectric conversion unit converts the partial light flux having been received thereat to the image signal;

the reduction unit ensures that the signal level of the focus detection signals output from the plurality of focus detection pixels under the given light receiving condition is equal to or less than the signal level of the image signals output from the plurality of image-capturing pixels under the given light receiving condition by making the first conversion characteristics different from the second conversion characteristics;

each of the plurality of image-capturing pixels and the plurality of focus detection pixels includes an output unit;

the output unit included in each of the plurality of image-capturing pixels amplifies an electrical signal obtained through photoelectric conversion of the partial light flux executed at the image-capturing photoelectric conversion unit and outputs the amplified electrical signal as the image signal;

the output unit included in each of the plurality of focus detection pixels amplifies an electrical signal obtained through photoelectric conversion of the focus detection light flux executed at the focus detection photoelectric conversion unit and outputs the amplified electrical signal as the focus detection signal; and the reduction unit ensures that the signal level of the focus detection signals output from the plurality of focus detection pixels under the given light receiving condition is equal to or less than the signal level of the image signals output from the plurality of image-capturing pixels under the given light receiving condition by setting a lower amplification factor at the output unit included in each of the plurality of focus detection pixels relative to an amplification factor set at the output unit included in each of the plurality of image-capturing pixels.

7. The image sensor according to claim 6, wherein:
the reduction unit ensures that the signal level of the focus detection signals output from the plurality of focus detection pixels under the given light receiving condition is equal to or less than the signal level of the image signals output from the plurality of image-capturing pixels under the given light receiving condition by setting a lower quantum efficiency level for the focus detection photoelectric conversion unit relative to a quantum efficiency level set for the image-capturing photoelectric conversion unit.

8. The image sensor according to claim 6, wherein:
one focus detection light flux in the pair of focus detection light fluxes passes through a pupil area in a pair of pupil areas of an optical system and another focus detection light flux in the pair of light fluxes passes through another pupil area in the pair of pupil areas;

the plurality of focus detection pixels include a pixel column made up with a plurality of focus detection pixels that output a first focus detection signal string constituted with first focus detection signals upon receiving the one focus detection light flux and a pixel column made up with a plurality of focus detection pixels that output a second focus detection signal string constituted with second focus detection signals upon receiving the other focus detection light flux; and the first focus detection signal string and the second focus detection signal string contain phase information indicating a focus adjustment state of the optical system.

* * * * *